United States Patent
Lin et al.

(10) Patent No.: US 11,605,728 B2
(45) Date of Patent: Mar. 14, 2023

(54) SEMICONDUCTOR DEVICE STRUCTURE WITH INNER SPACER LAYER

(71) Applicant: TAIWAN SEMICONDUCTOR MANUFACTURING COMPANY, LTD., Hsinchu (TW)

(72) Inventors: Han-Yu Lin, Nantou County (TW); Chansyun David Yang, Shinchu (TW); Fang-Wei Lee, Hsinchu (TW); Tze-Chung Lin, Hsinchu (TW); Li-Te Lin, Hsinchu (TW); Pinyen Lin, Rochester, NY (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/504,104

(22) Filed: Oct. 18, 2021

(65) Prior Publication Data
US 2022/0045194 A1 Feb. 10, 2022

Related U.S. Application Data

(62) Division of application No. 16/299,531, filed on Mar. 12, 2019, now Pat. No. 11,152,491.
(Continued)

(51) Int. Cl.
*H01L 29/66* (2006.01)
*H01L 29/165* (2006.01)
(Continued)

(52) U.S. Cl.
CPC ...... *H01L 29/6681* (2013.01); *H01L 21/0214* (2013.01); *H01L 21/02167* (2013.01);
(Continued)

(58) Field of Classification Search
CPC ..................................................... H01L 29/165
See application file for complete search history.

(56) References Cited

U.S. PATENT DOCUMENTS 9,209,247 B2 12/2015 Colinge et al.
9,236,267 B2 1/2016 De et al.
(Continued)

OTHER PUBLICATIONS

U.S. Appl. No. 16/299,531, filed Mar. 12, 2019.

*Primary Examiner* — Mounir S Amer
(74) *Attorney, Agent, or Firm* — Birch, Stewart, Kolasch & Birch, LLP

(57) ABSTRACT

A semiconductor device structure is provided. The semiconductor device includes a first nanowire structure over a second nanowire structure, a gate stack wrapping around the first nanowire structure and the second nanowire structure, a source/drain feature adjoining the first nanowire structure and the second nanowire structure, a gate spacer layer over the first nanowire structure and between the gate stack and the source/drain feature, and an inner spacer layer between the first nanowire structure and the second nanowire structure and between the gate stack and the source/drain feature. The gate spacer layer has a first carbon concentration, the inner spacer has a second carbon concentration, and the second carbon concentration is lower than the first carbon concentration.

20 Claims, 21 Drawing Sheets

Related U.S. Application Data

(60) Provisional application No. 62/721,931, filed on Aug. 23, 2018.

(51) Int. Cl.
  *H01L 21/02* (2006.01)
  *H01L 21/768* (2006.01)
  *H01L 21/311* (2006.01)
  *H01L 29/78* (2006.01)
  *H01L 21/321* (2006.01)
  *H01L 29/06* (2006.01)

(52) U.S. Cl.
  CPC .. *H01L 21/02532* (2013.01); *H01L 21/02603* (2013.01); *H01L 21/31116* (2013.01); *H01L 21/3211* (2013.01); *H01L 21/32105* (2013.01); *H01L 21/7682* (2013.01); *H01L 21/76837* (2013.01); *H01L 29/0673* (2013.01); *H01L 29/165* (2013.01); *H01L 29/66545* (2013.01); *H01L 29/66553* (2013.01); *H01L 29/785* (2013.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,647,139 B2 | 5/2017 | Doris et al. |
| 2014/0001441 A1 | 1/2014 | Kim et al. |
| 2014/0151638 A1* | 6/2014 | Chang .................... B82Y 40/00 257/27 |
| 2016/0141381 A1 | 5/2016 | Kim et al. |
| 2016/0315167 A1* | 10/2016 | Nakamura ........ H01L 29/66742 |
| 2018/0026490 A1* | 1/2018 | Raguin ................. H02K 1/185 310/427 |
| 2018/0226490 A1 | 8/2018 | Le et al. |
| 2019/0214502 A1* | 7/2019 | Xu ........................ H01L 29/775 |

\* cited by examiner

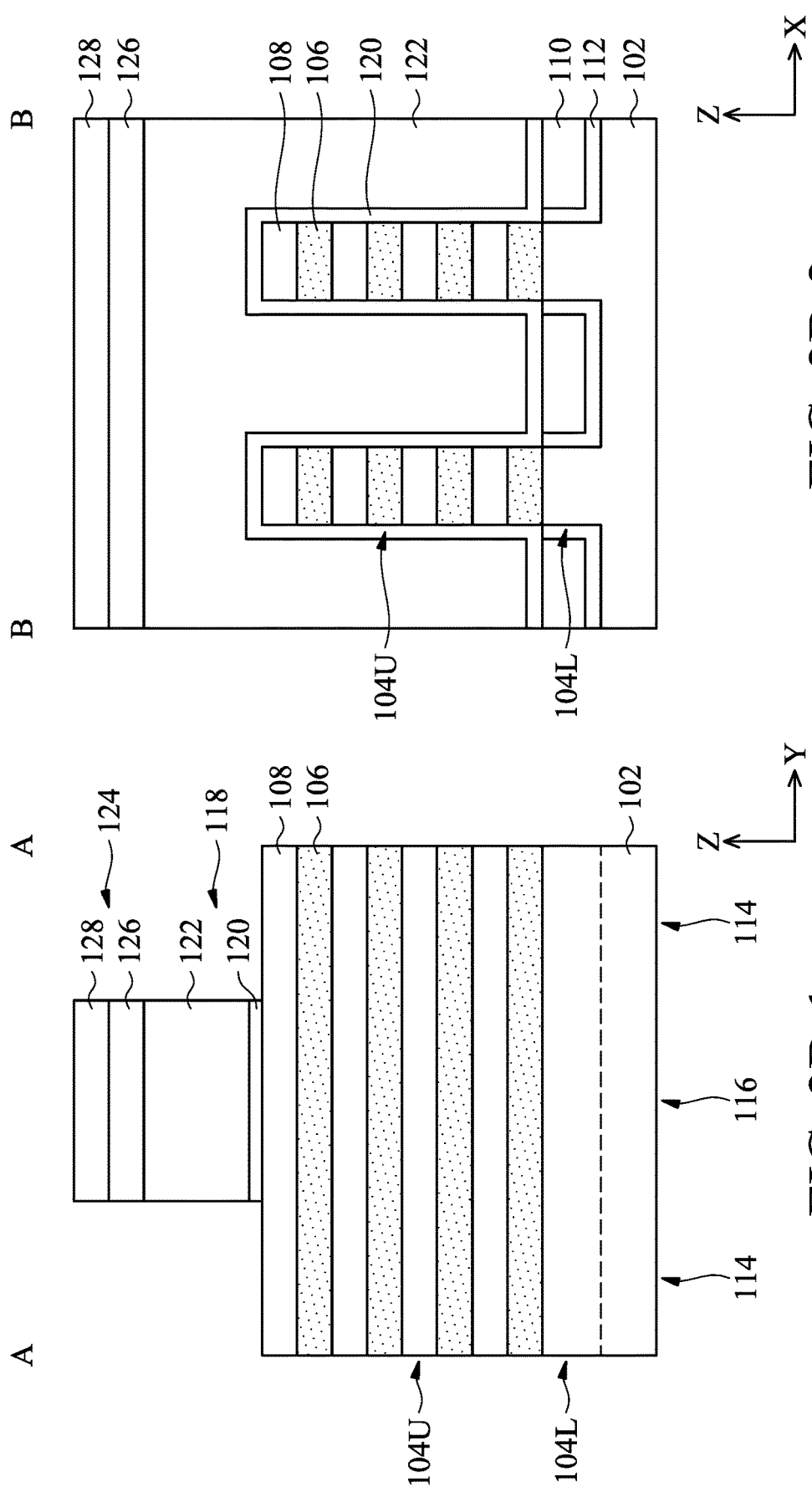

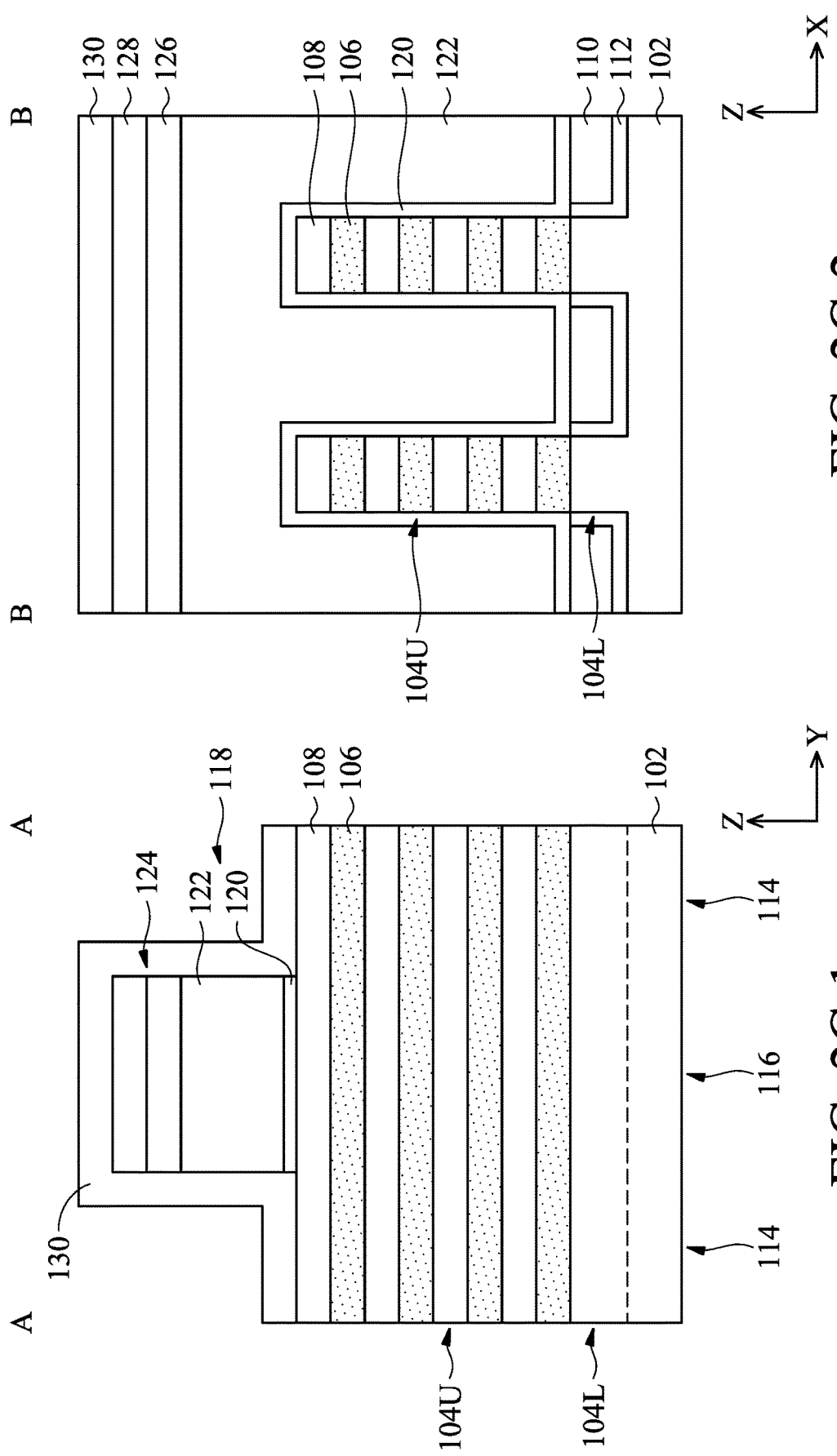

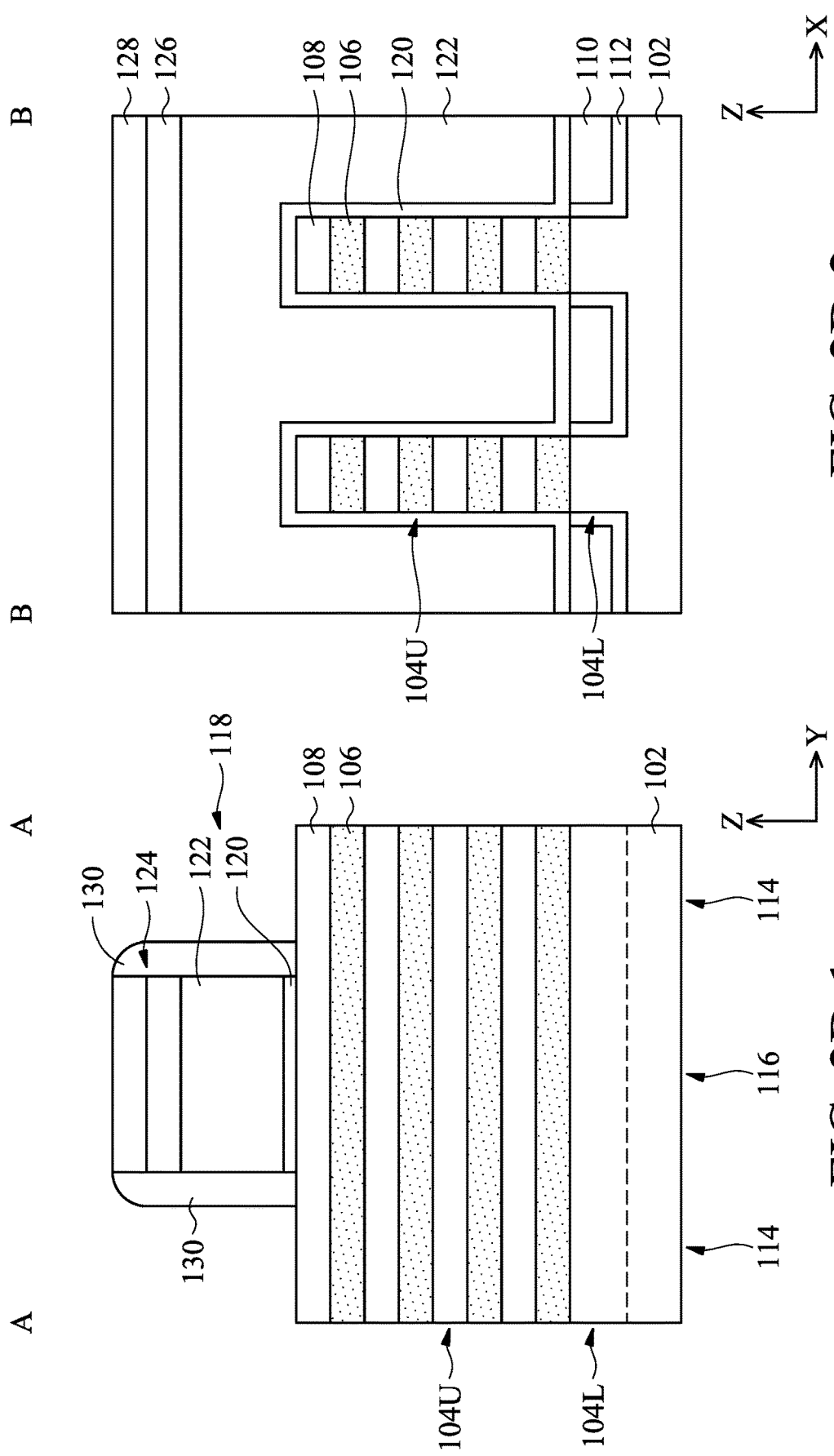

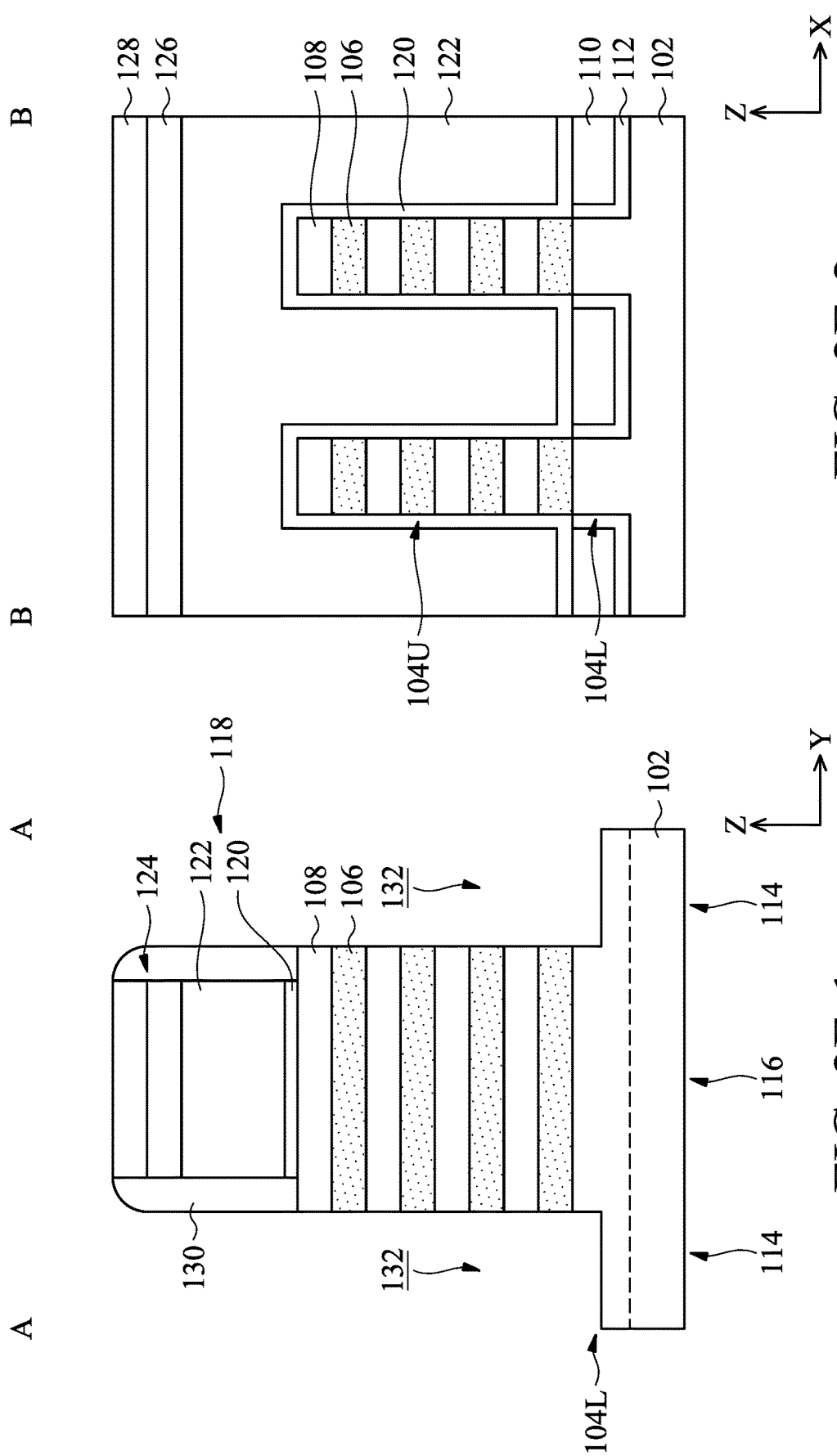

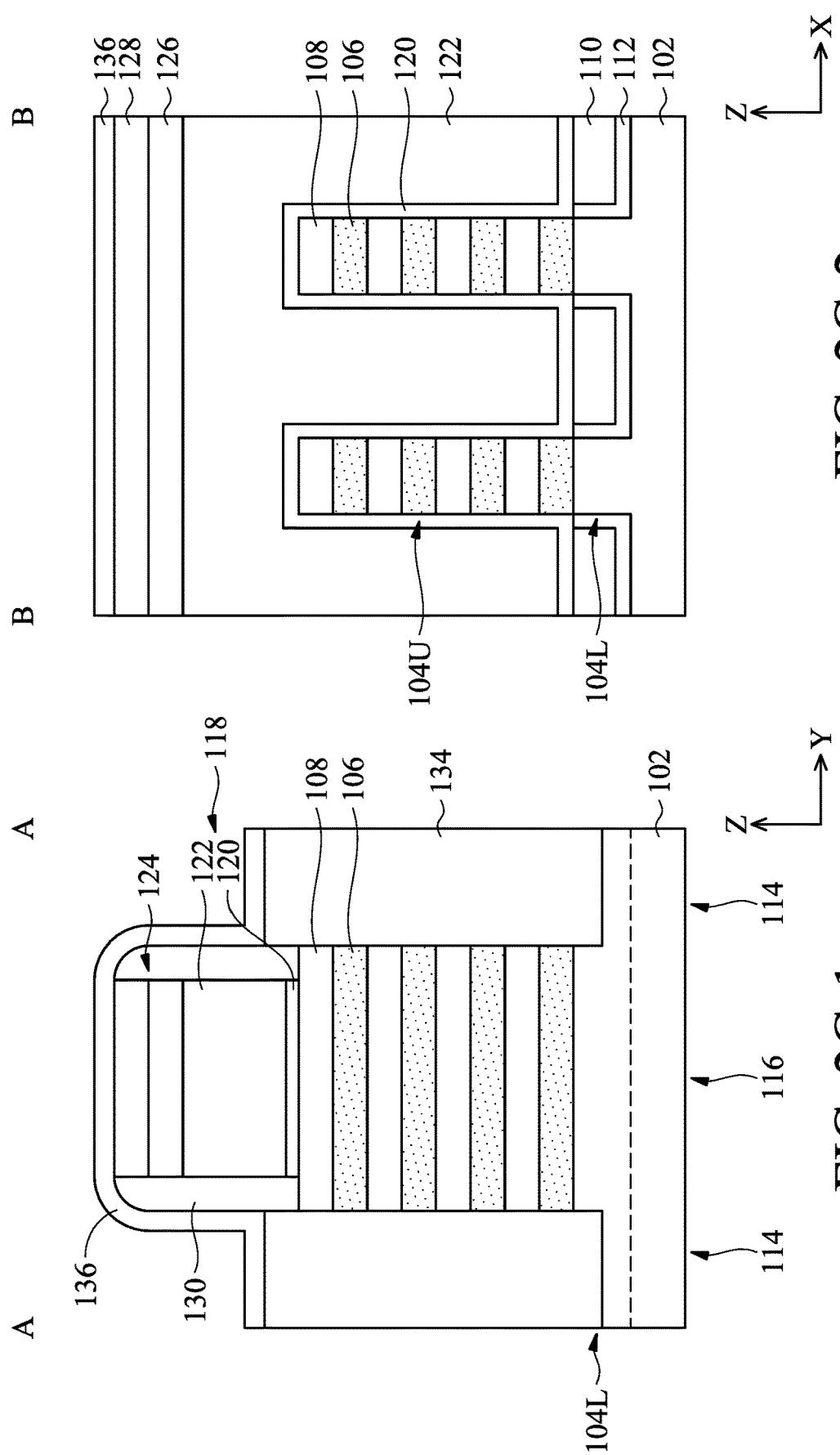

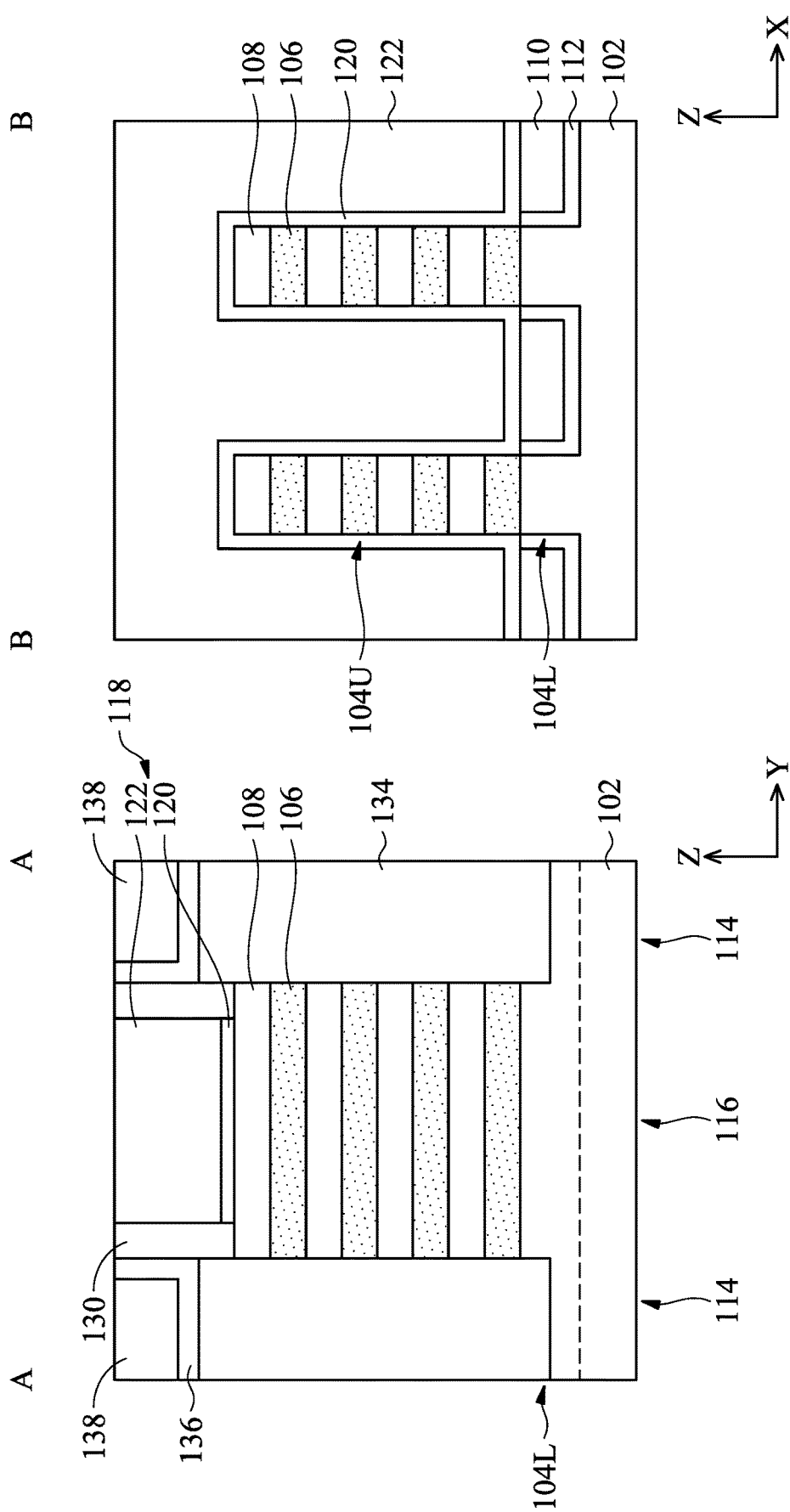

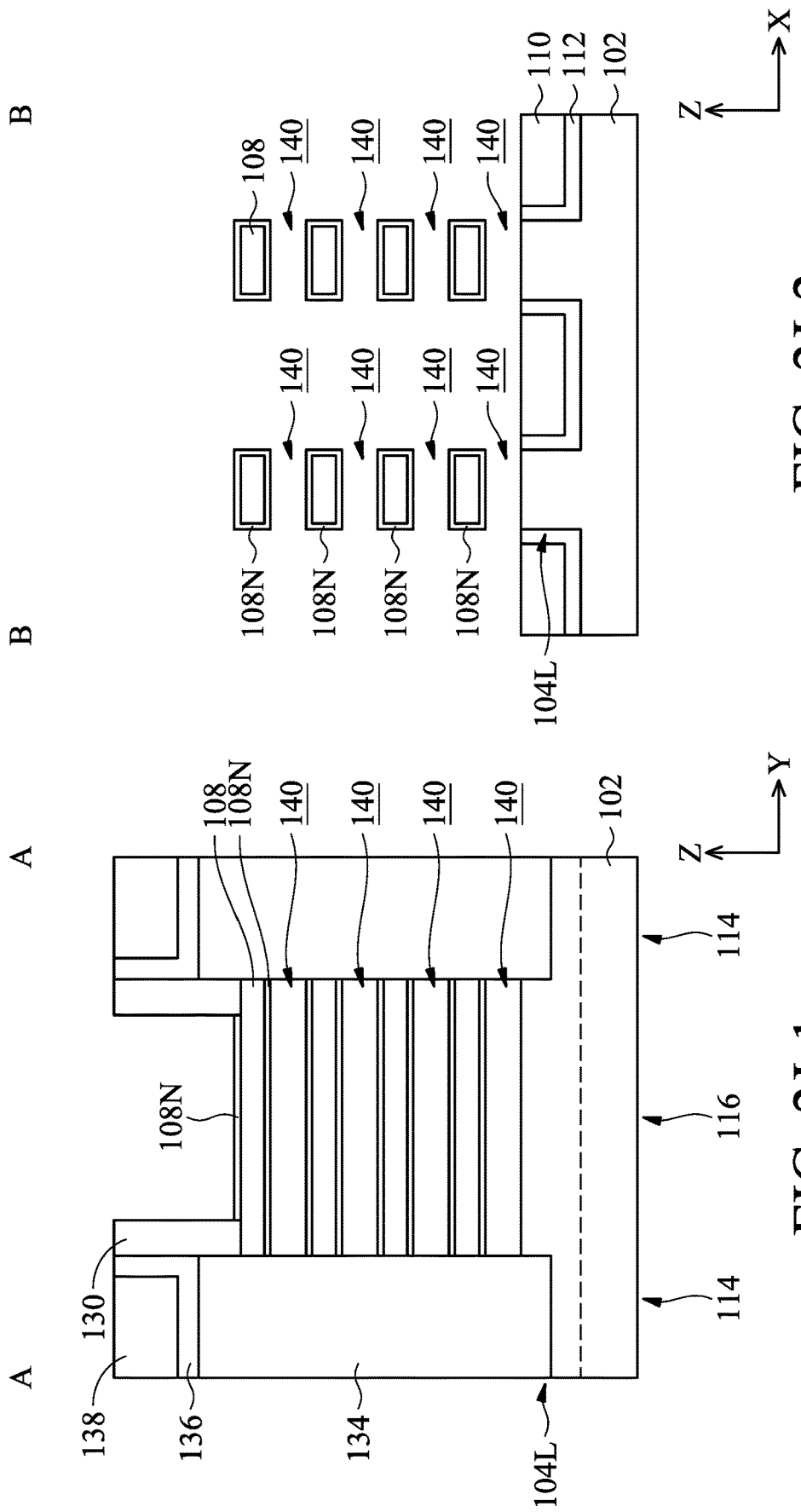

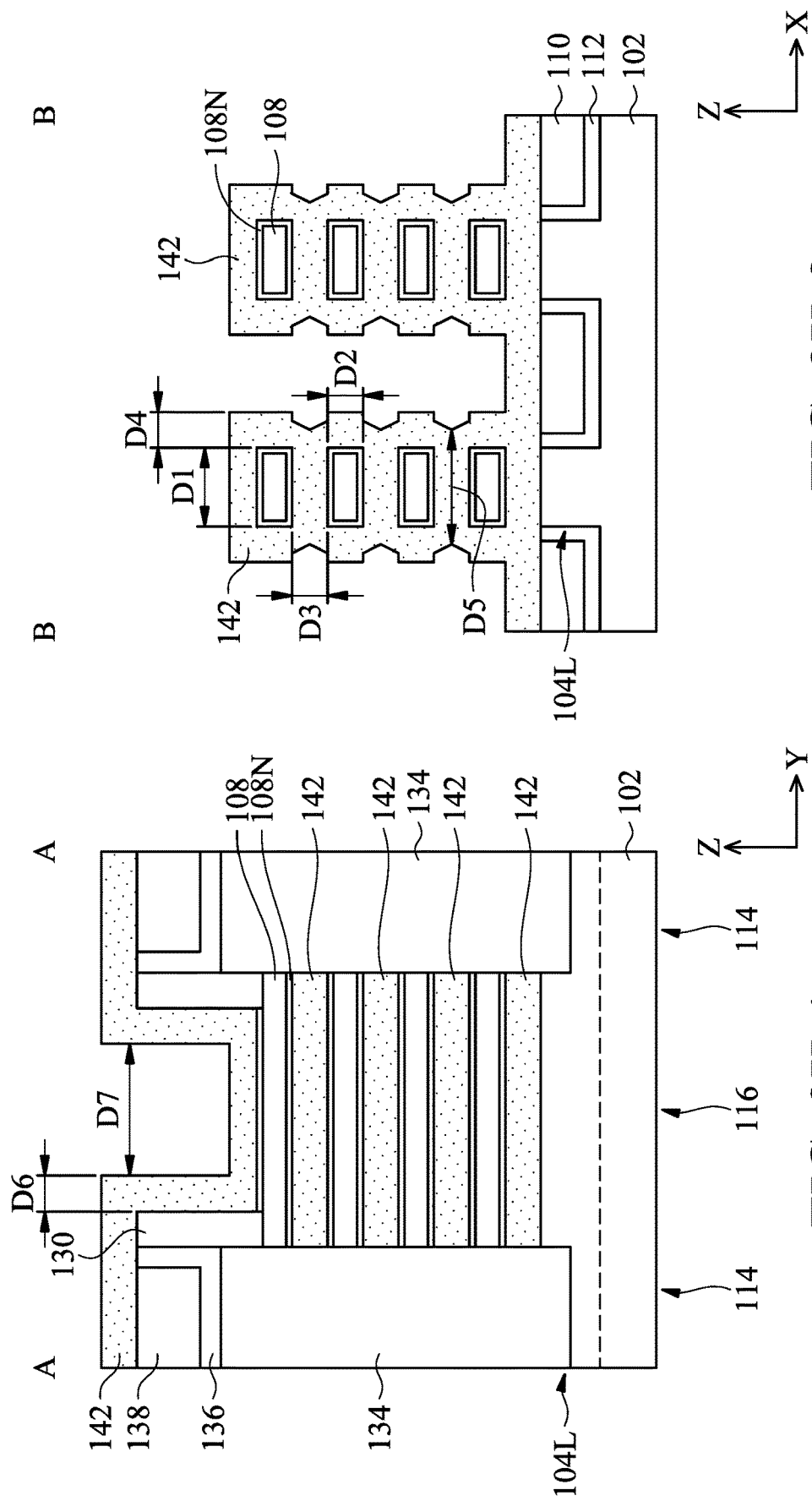

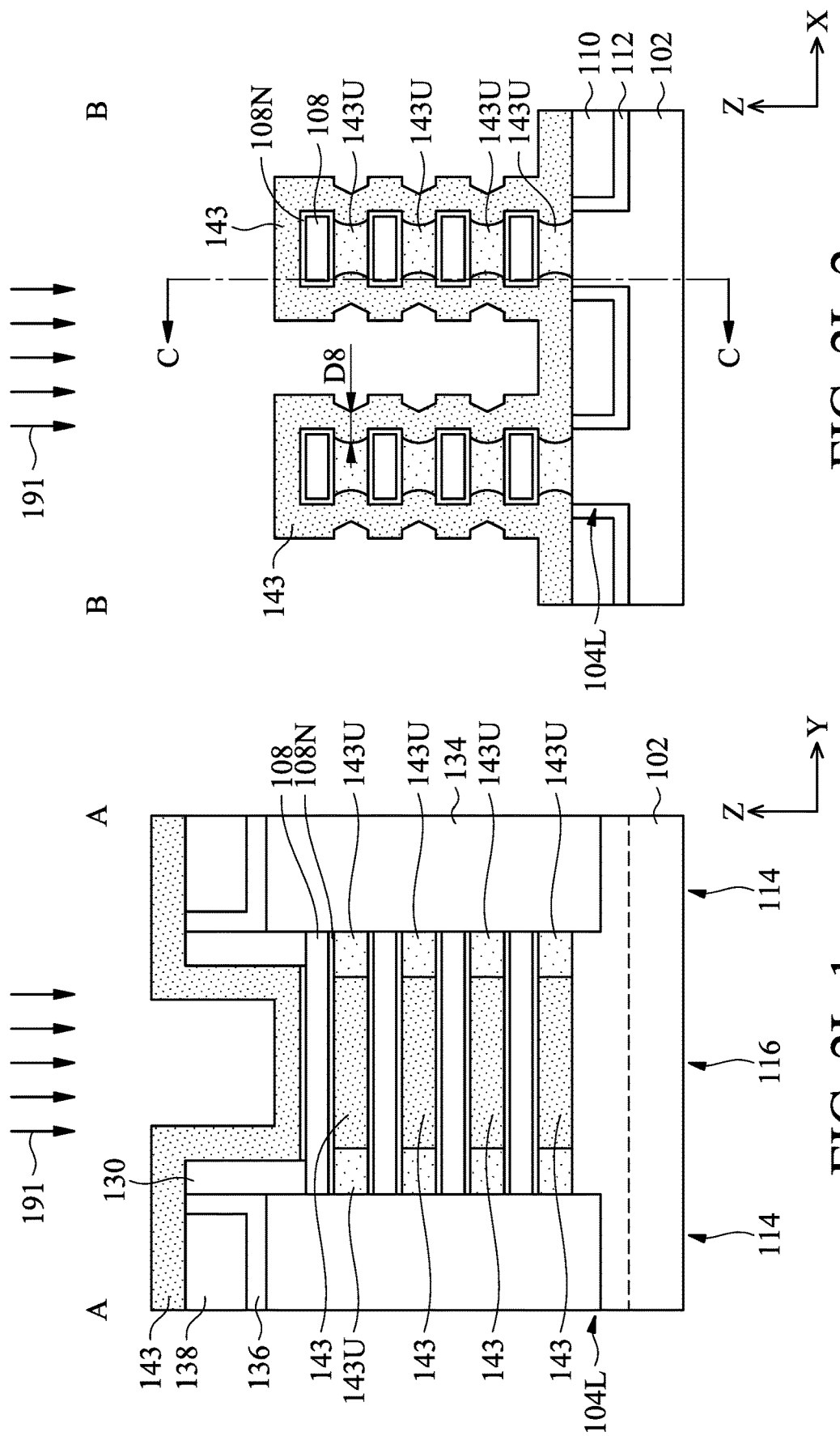

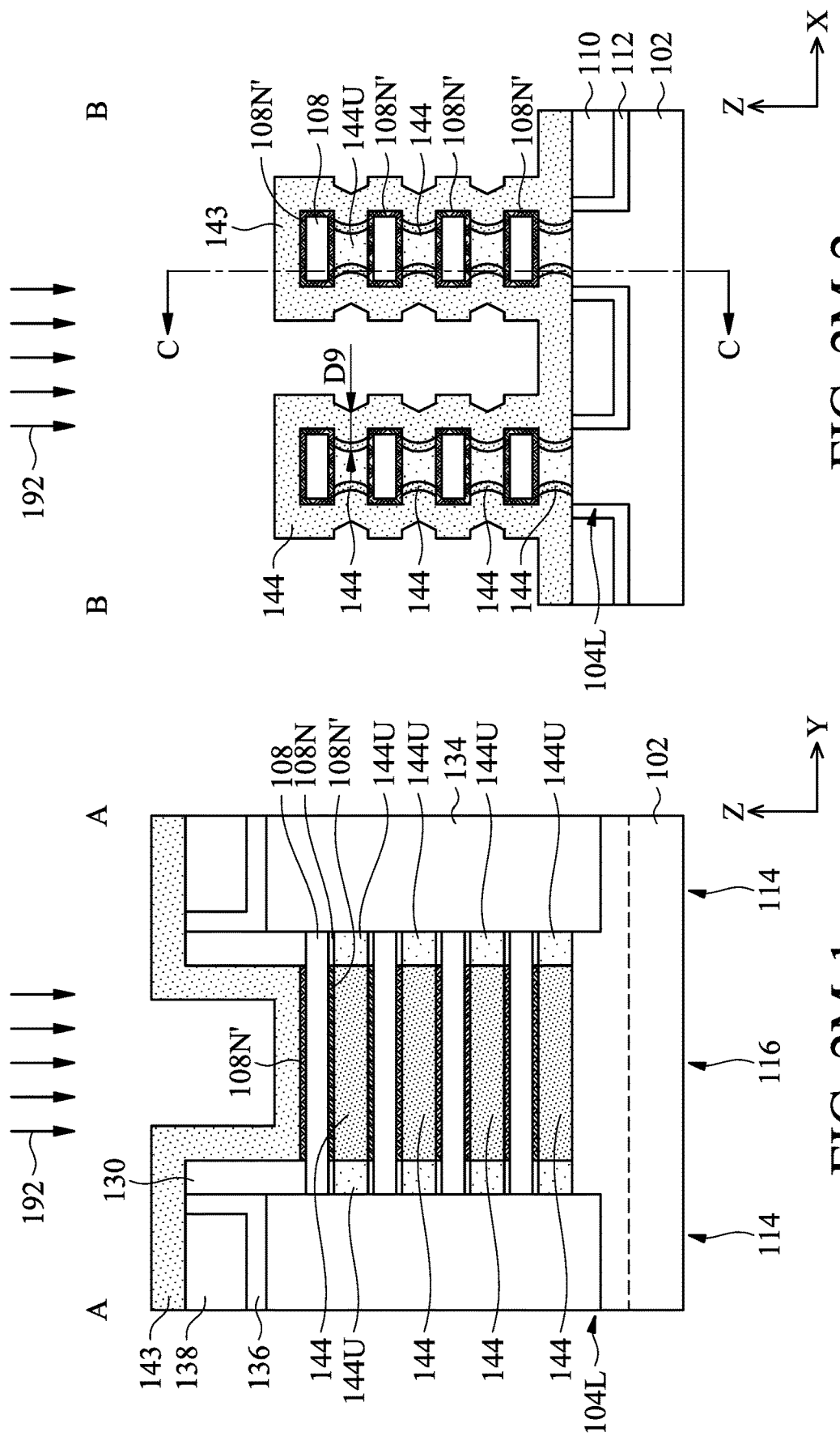

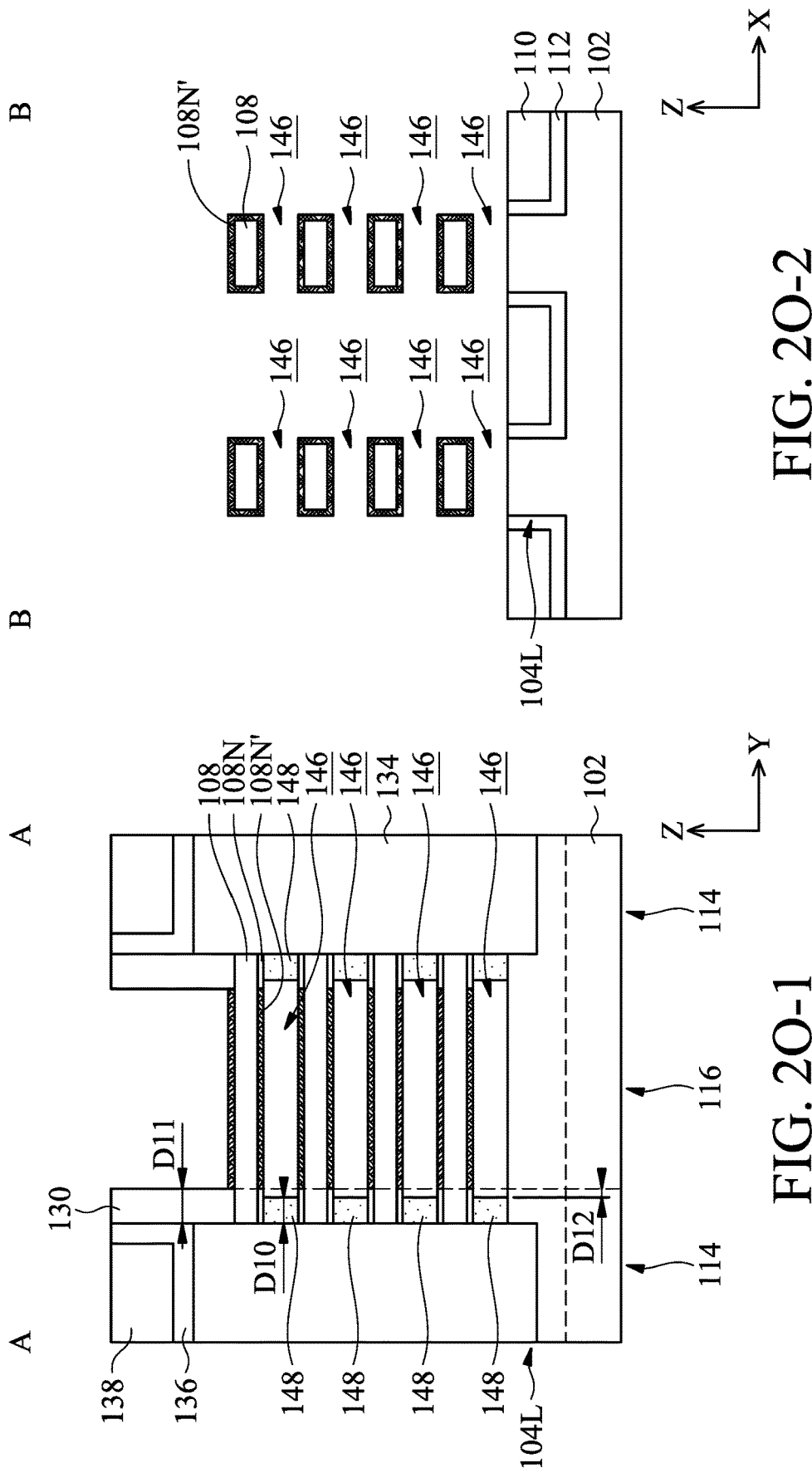

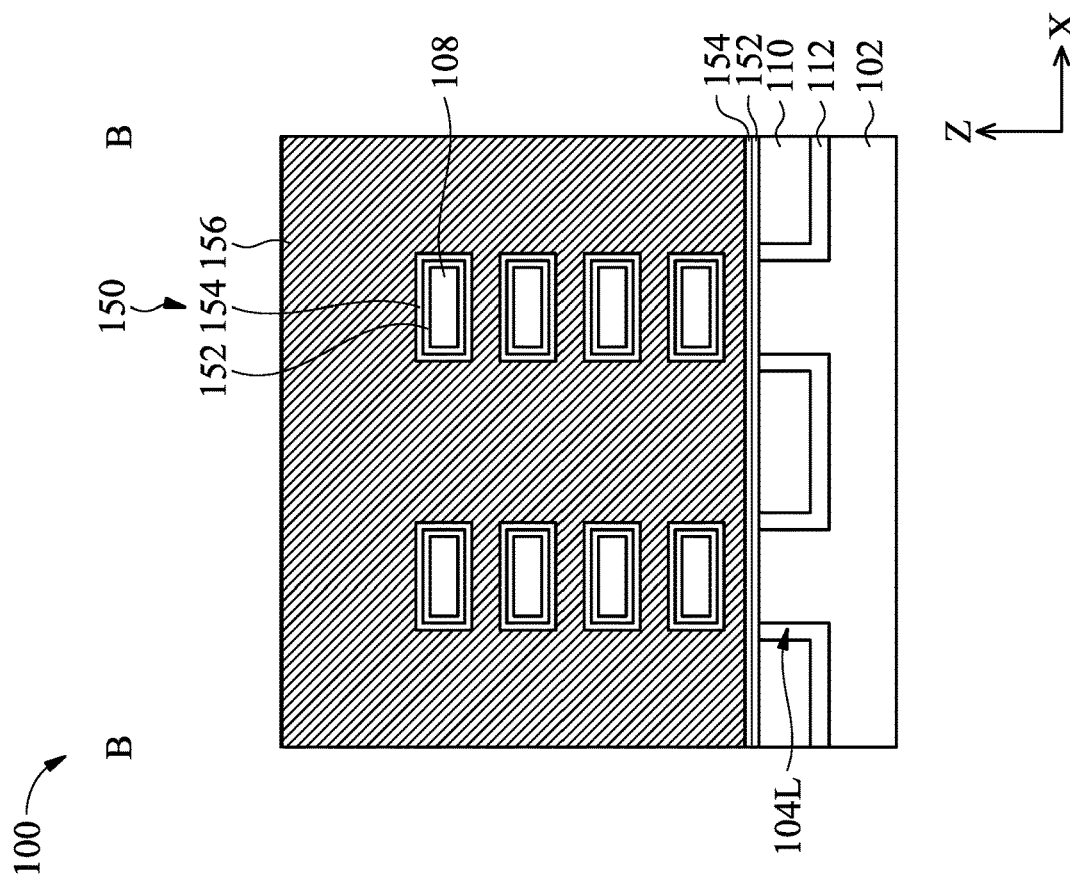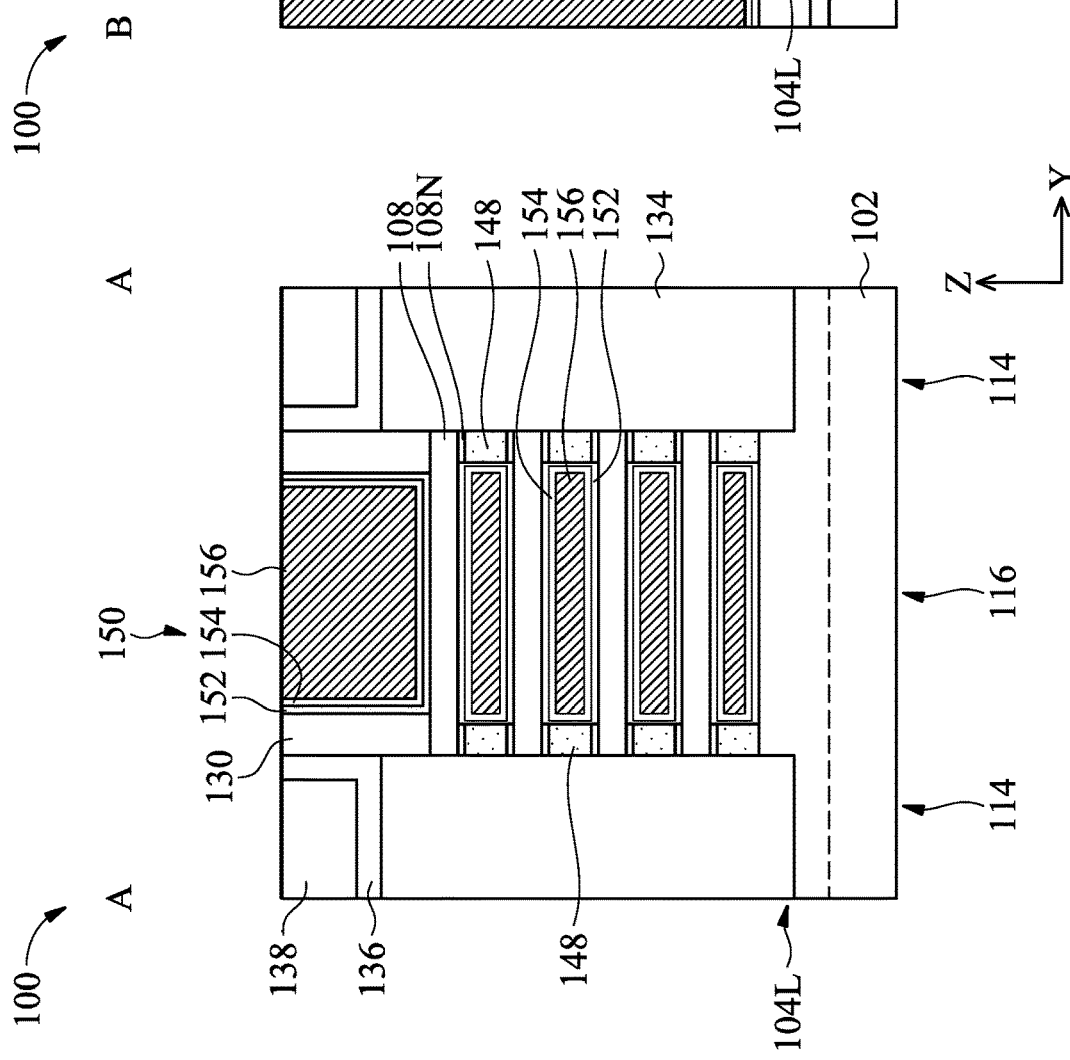

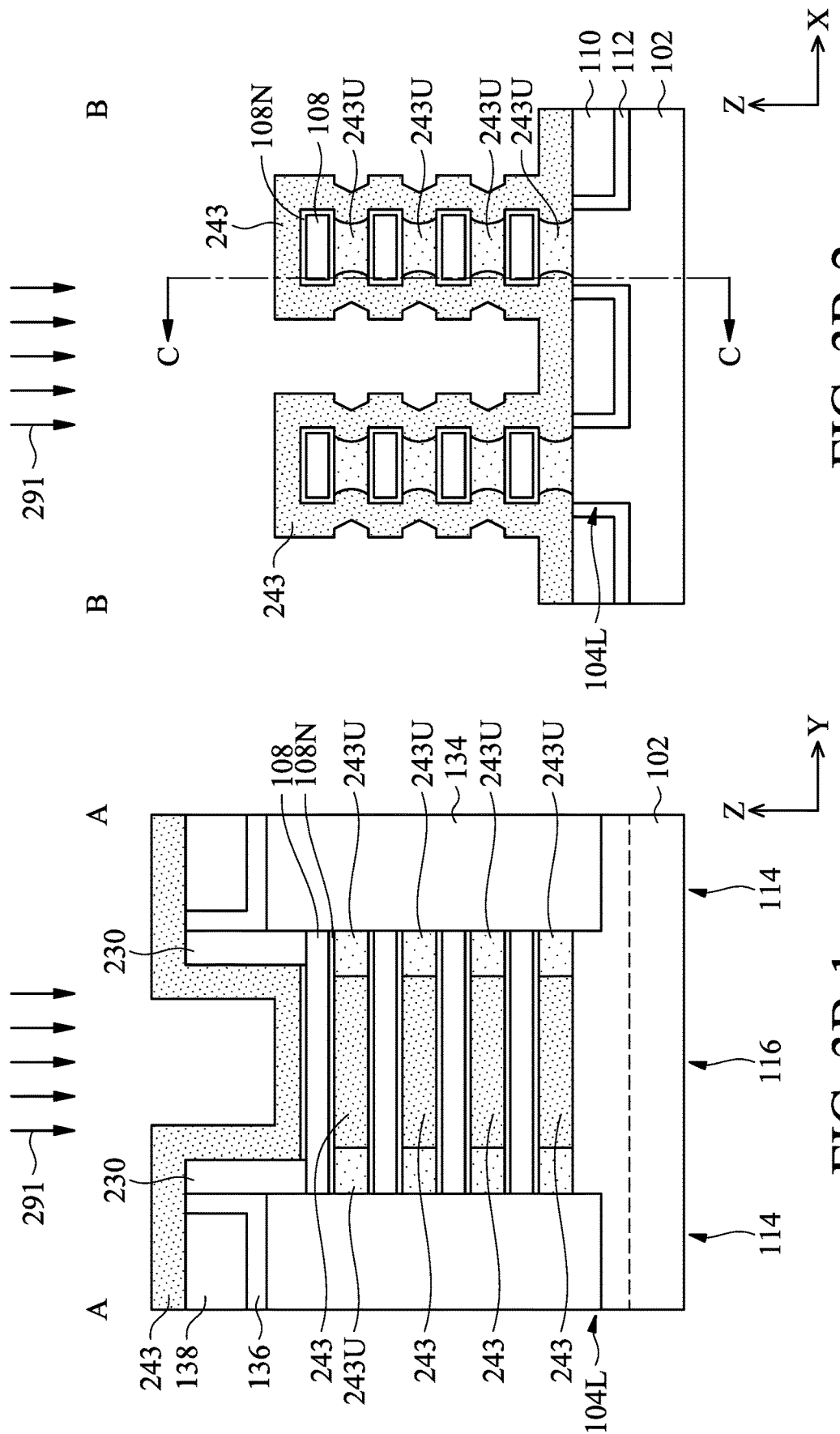

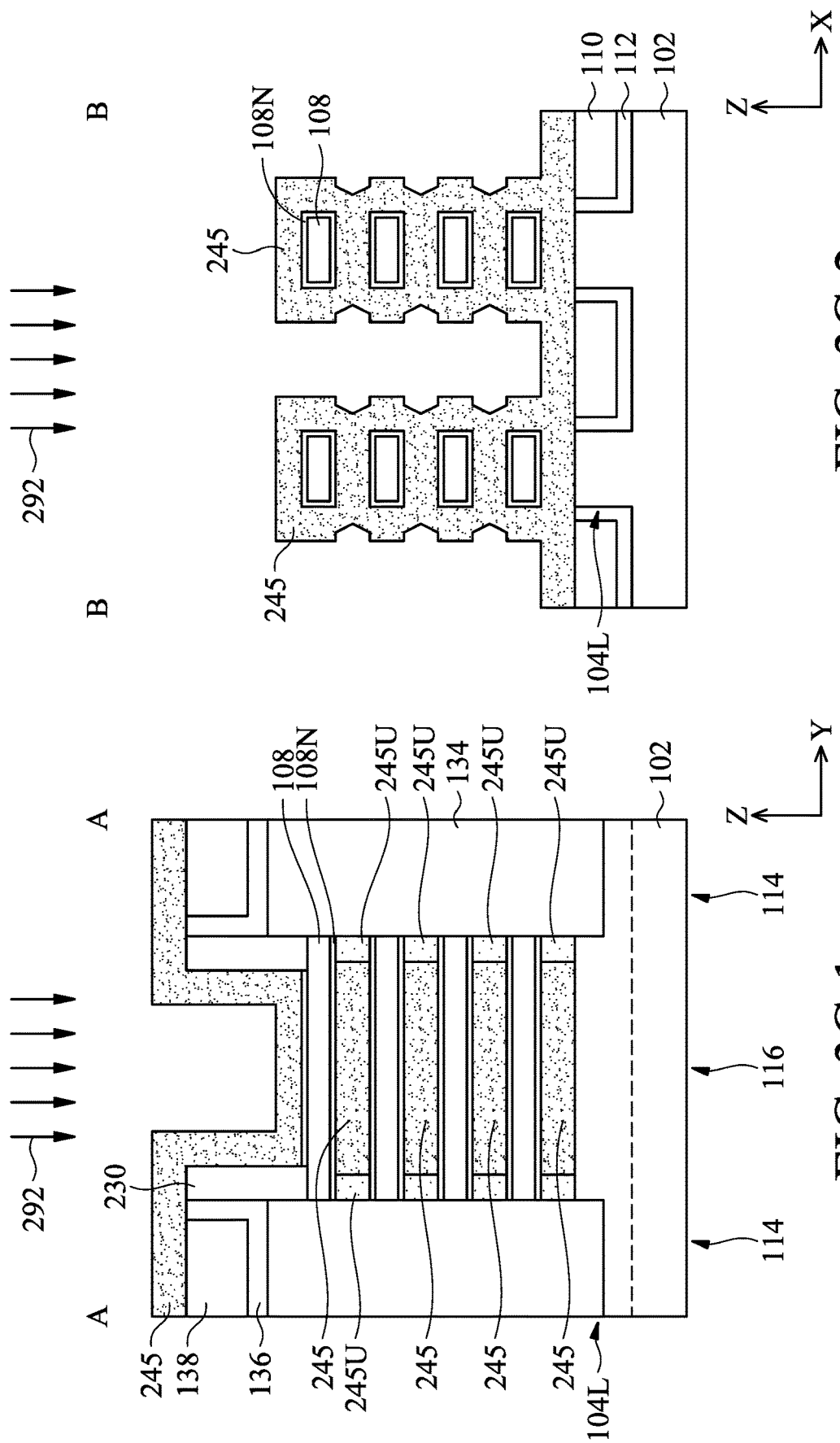

SEMICONDUCTOR DEVICE STRUCTURE WITH INNER SPACER LAYER

PRIORITY CLAIM

This application is a Divisional Application of U.S. application Ser. No. 16/299,531, filed on Mar. 12, 2019, entitled "METHOD FOR FORMING SEMICONDUCTOR DEVICE STRUCTURE WITH INNER SPACER LAYER," which claims the benefit of U.S. Provisional Application No. 62/721,931, filed on Aug. 23, 2018 and entitled "NANO WIRE/SHEET DEVICE STRUCTURE AND METHOD FOR FORMING THE SAME," all of which are incorporated herein by reference.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced increased complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while the current methods have been satisfactory in many respects, continued improvements are still needed.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 2A-1 through 2P-1 are cross-sectional views illustrating the formation of a semiconductor device along line A-A in FIG. 1 at various intermediate stages, in accordance with some embodiments.

FIGS. 2A-2 through 2P-2 are cross-sectional views illustrating the formation of a semiconductor device along line B-B in FIG. 1 at various intermediate stages, in accordance with some embodiments.

FIGS. 3A-1 through 3D-1 are cross-sectional views illustrating the formation of an inner spacer layer along line A-A in FIG. 1 at various intermediate stages, in accordance with some embodiments.

FIGS. 3A-2 through 3D-2 are cross-sectional views illustrating the formation of an inner spacer layer along line B-B in FIG. 1 at various intermediate stages, in accordance with some embodiments.

DETAILED DESCRIPTION

Figure 1:
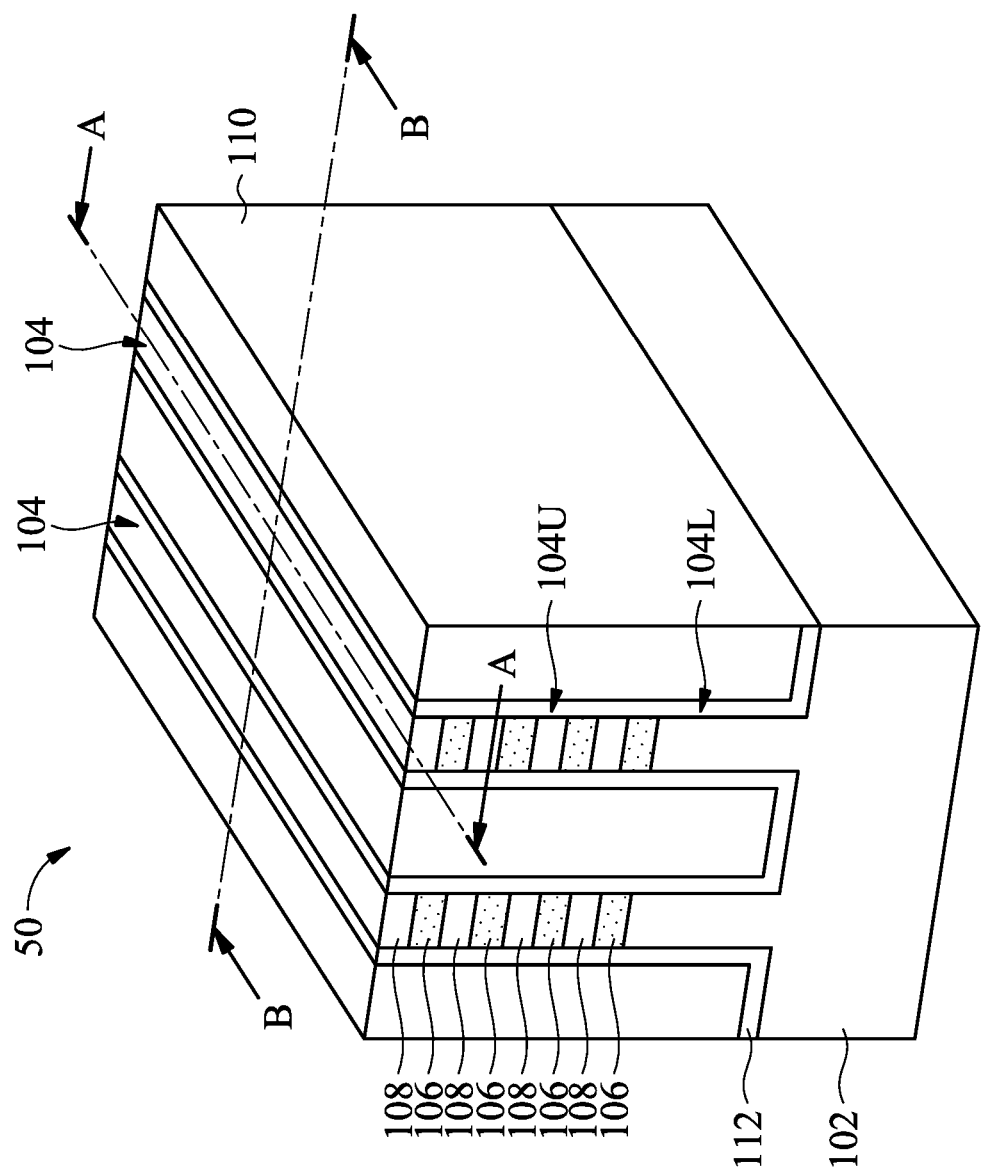
FIG. 1 is a perspective view of a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments for forming a semiconductor device (e.g. GAA structure) are provided. The method for forming the semiconductor device may include forming an inner spacer layer between a gate stack and a source/drain feature to reduce the parasitic capacitance between the gate stack and the source/drain feature (i.e. Cgs and Cgd). In addition, the formation of the inner spacer layer may include forming a dielectric material followed by locally treating the dielectric material. Because an etching selectivity exists between the treated portion and the untreated portion of the dielectric material, a subsequent etching process can be well controlled to remove the treated portion thereby leaving the untreated portion to serve as an inner spacer layer.

Figures 1, 2, 2A:
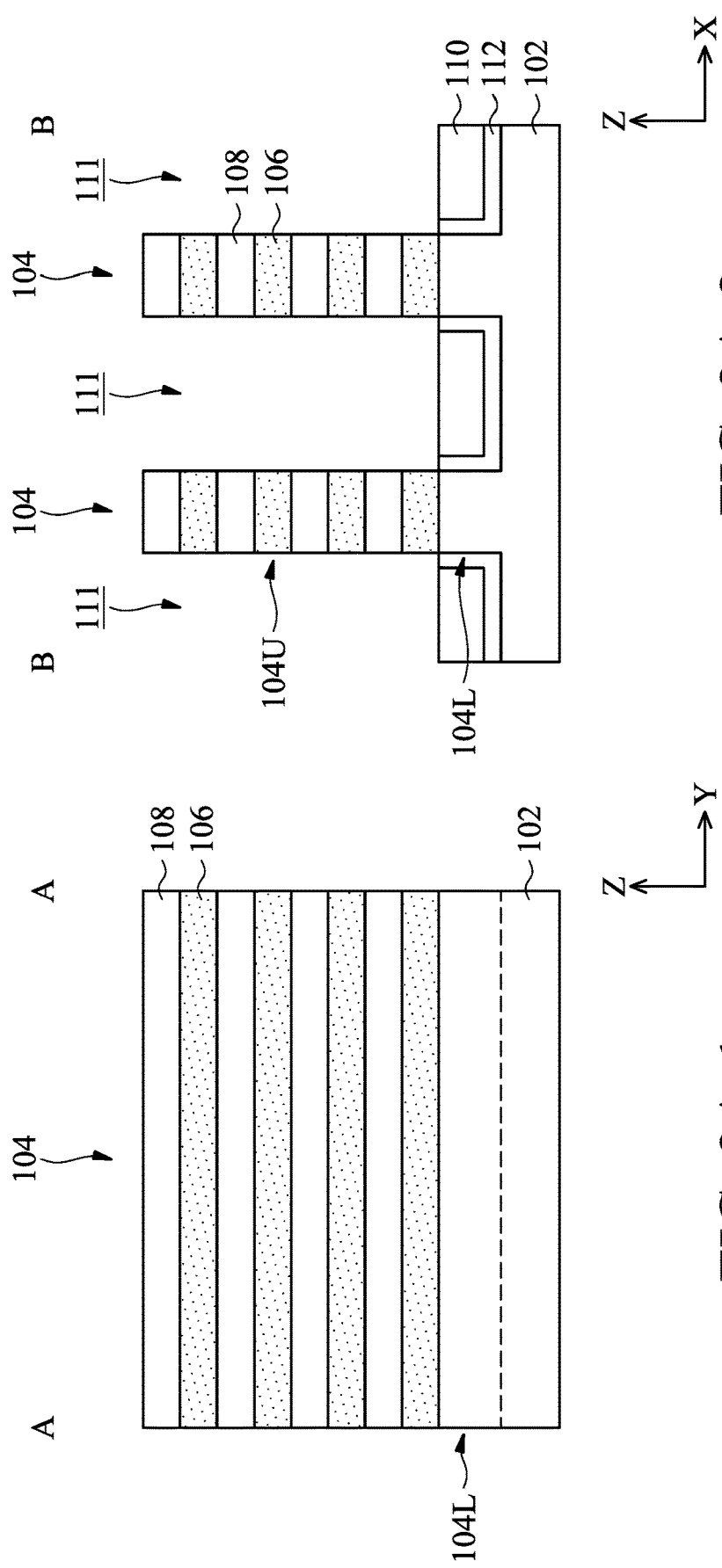

FIG. 1 is a perspective view of a semiconductor device structure 50, in accordance with some embodiments of the disclosure. FIGS. 2A-1 through 2P-1 are cross-sectional views illustrating the formation of a semiconductor device 100 along line A-A in FIG. 1 at various intermediate stages, in accordance with some embodiments. FIGS. 2A-2 through 2P-2 are cross-sectional views illustrating the formation of the semiconductor device 100 along line B-B in FIG. 1 at various intermediate stages, in accordance with some embodiments.

A semiconductor device structure 50 is provided, as shown in FIG. 1, in accordance with some embodiments. The formation of the semiconductor device structure 50 includes providing a substrate 102, and forming fin structures 104 and isolation structures 110 over the substrate 102, in accordance with some embodiments. The fin structures 104 are separated from each other by the isolation structure 110, in accordance with some embodiments. Each of the fin structures 104 is surrounded by the isolation structures 110, in accordance with some embodiments.

In some embodiments, the substrate 102 is a semiconductor substrate such as a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. In some embodiments, the substrate 102 includes an epitaxial layer (epi-layer) overlying a bulk semiconductor substrate. In some embodiments, the substrate 102 is a semiconductor-on-insulator (SOI) substrate which may include a semiconductor substrate, a buried oxide layer over the substrate, and a semiconductor layer over the buried oxide layer.

The fin structures 104 are arranged in the X direction, as shown in FIG. 1, in accordance with some embodiments. The fin structures 104 extend in the Y direction, in accordance with some embodiments. The fin structures 104 each include a lower portion 104L and an upper portion 104U, in accordance with some embodiments. The lower portion 104L of the fin structure 104 is formed by a portion of the substrate 102, in accordance with some embodiments. The upper portion 104U of the fin structure 104 is formed by a stacked semiconductor structure, which includes first semiconductor layers 106 and second semiconductor layers 108 alternately stacked over the lower portion 104L, in accordance with some embodiments. In some embodiments, there are between 2 and 10 first semiconductor layers 106 and there are between 2 and 10 second semiconductor layers 108.

As explained in detail below, the first semiconductor layers 106 of the fin structures 104 will be removed so that the second semiconductor layers 108 of the fin structures 104 form a nanowire structure extending between source/drain features, in accordance with some embodiments. The nanowire structure of the second semiconductor layers 108 will be surrounded by a gate stack to serve as a channel region of the semiconductor device 100, in accordance with some embodiments. For example, the embodiments described herein illustrate processes and materials that may be used to form nanowire structures with a GAA design for n-type FinFETs or p-type FinFETs.

The first semiconductor layers 106 and the second semiconductor layers 108 are made of materials having different lattice constants, in accordance with some embodiments. In some embodiments, the first semiconductor layers 106 and the second semiconductor layers 108 include Si, Ge, SiGe, GaAs, InSb, GaP, GaSb, InAlAs, InGaAs, GaSbP, GaAs Sb, or InP.

In some embodiments, the first semiconductor layers 106 are made of SiGe, where the percentage of germanium (Ge) in the SiGe is in the range from about 20 atomic % to about 50 atomic %, and the second semiconductor layers 108 are made of silicon. In some embodiments, the first semiconductor layers 106 are $Si_{1-x}Ge_x$, where x is more than about 0.3, or Ge (x=1.0) and the second semiconductor layers 108 are Si or $Si_{1-y}Ge_y$, where y is less than about 0.4, and x>y.

In some embodiments, the thickness of each of the first semiconductor layers 106 is in a range from about 1.5 nanometers (nm) to about 20 nm. In some embodiments, the first semiconductor layers 106 are substantially uniform in thickness. In some embodiments, the thickness of each of the second semiconductor layers 108 is in a range from about 1.5 nm to about 20 nm. In some embodiments, the second semiconductor layers 108 are substantially uniform in thickness.

In some embodiments, the formation of the fin structures 104 includes forming a stacked semiconductor structure including a first semiconductor material for first semiconductor layers 106 and a second semiconductor material for second semiconductor layers 108 over the substrate 102, and patterning the stacked semiconductor structure and the underlying substrate 102.

In some embodiments, the first semiconductor materials and the second semiconductor materials are formed using low pressure chemical vapor deposition (LPCVD), epitaxial growth process, another suitable method, and/or a combination thereof. In some embodiments, the epitaxial growth process includes molecular beam epitaxy (MBE), metal organic chemical vapor deposition (MOCVD), or vapor phase epitaxy (VPE).

In some embodiments, the patterning process includes forming a hard mask layer over the stacked semiconductor structure, and etching the semiconductor structure and the underlying substrate 102 through the hard mask layer. In some embodiments, the hard mask layer includes one or more dielectric material, such as silicon oxide, silicon nitride, silicon oxynitride, other suitable dielectric materials, and/or a combination thereof.

In some embodiments, the etching process of the patterning process removes the stacked semiconductor structure which is uncovered by the hard mask layer and further recesses the substrate 102 to form trenches. In some embodiments, after the etching process, the substrate 102 has portions which protrudes from between the trenches to form the lower portions 104L of the fin structure 104. In some embodiments, a remaining stacked semiconductor structure forms the upper portion 104U of the fin structure 104. In some embodiments, the etching process includes a dry etching process, such as reactive ion etch (RIE) or neutral beam etch (NBE), a wet etching process, and/or a combination thereof.

After the fin structures 104 are formed, a lining layer 112 is conformally formed along the substrate 102, the fin structures 104, and the hard mask layer, in accordance with some embodiments. In some embodiment, the lining layer 112 includes a bilayer structure, such as a silicon oxide layer and a silicon nitride layer formed on the silicon oxide layer. In some embodiments, the lining layer 112 is formed using a thermal oxidation, CVD, atomic layer deposition (ALD), another suitable method, and/or a combination thereof.

Afterward, an insulating material for the isolation structures 110 is formed over the lining layer 112, in accordance with some embodiments. The insulating material fills the trenches and covers the upper surface of the hard mask layer, in accordance with some embodiments.

In some embodiments, the insulating material includes silicon oxide, silicon nitride, silicon oxynitride (SiON), other suitable insulating materials, and/or a combination thereof. In some embodiments, the insulating material is formed using LPCVD, plasma enhanced CVD (PECVD), high density plasma CVD (HDP-CVD), high aspect ratio process (HARP), flowable CVD (FCVD), ALD, another suitable method, and/or a combination thereof.

Afterward, the insulating material and the lining layer 112 formed above the hard mask layer are removed, in accordance with some embodiments. In some embodiments, the removal process is an etch-back process, chemical mechanical polishing (CMP), and/or a combination thereof. In some embodiments, the removal process also removes the hard mask layer and exposes the upper surfaces of the fin structures 104.

The isolation structures 110 and the lining layer 112 are recessed to form the trenches 111, as shown in FIGS. 2A-1 and 2A-2, in accordance with some embodiments. In some embodiments, the isolation structures 110 and the lining layer 112 are recessed using one or more selective etch processes, such as a dry etching process, a wet etching process, and/or a combination thereof.

The trenches 111 expose the upper surfaces and the sidewalls of the upper portions 104U of the fin structures 104, in accordance with some embodiments. The upper portion 104U of each of the fin structures 104 protrudes from between the recessed isolation structures 110, in accordance with some embodiments. The lower portions 104L of the fin structures 104 are embedded in the recessed isolation structures 110, in accordance with some embodiments.

A dummy gate structure 118 and a hard mask layer 124 are formed over the fin structures 104, as shown in FIGS. 2B-1 and 2B-2, in accordance with some embodiments. The hard mask layer 124 is formed over the dummy gate structure 118, in accordance with some embodiments. The dummy gate structure 118 extends in the X direction and across the fin structures 104, in accordance with some embodiments.

The dummy gate structure 118 is used to define source/drain regions 114 of the fin structure 104 and a channel region 116 of the fin structure 104, as shown in FIG. 2B-1, in accordance with some embodiments. The source/drain regions 114 are on opposite sides of the channel region 116, in accordance with some embodiments. In specific, the dummy gate structure 118 is filled into the recesses 111 (shown in FIG. 2A-2) and covers the upper surfaces and the sidewalls of the fin structures 104 in the channel region 116, in accordance with some embodiments. The dummy gate structure 118 does not cover the fin structures in the source/drain regions 114, in accordance with some embodiments.

The dummy gate structure 118 includes a dummy gate dielectric layer 120 and a dummy gate electrode layer 122, in accordance with some embodiments. In some embodiments, the dummy gate dielectric layer 120 is made of one or more dielectric materials, such as silicon oxide, silicon nitride, silicon oxynitride (SiON), and/or a combination thereof. In some embodiments, the dummy gate dielectric layer 120 is made of a dielectric material with high dielectric constant (k value), for example, greater than 3.9. In some embodiments, the high-K dielectric material includes $HfO_2$, HfZrO, HfSiO, HfTiO, HfAlO, another suitable high-K dielectric material, and/or a combination thereof. In some embodiments, the dielectric material is formed using a thermal oxidation, CVD, ALD, physical vapor deposition (PVD), another suitable method, and/or a combination thereof.

In some embodiments, the dummy gate electrode layer 122 is made of a conductive material. In some embodiments, the conductive material includes polycrystalline-silicon (poly-Si), poly-crystalline silicon-germanium (poly-SiGe), metallic nitrides, metallic silicides, metals, and/or a combination thereof. In some embodiments, the conductive material is formed using CVD, PVD, and/or a combination thereof.

In some embodiments, the formation of the dummy gate structure 118 includes conformally forming the dielectric material for the dummy gate dielectric layer 120 along the upper surface of the substrate 102 and the sidewalls and the upper surfaces of the upper portions 104U of the fin structures 104, and forming the conductive material for dummy gate electrode layer 122 over the dielectric material for the dummy gate dielectric layer 120.

In some embodiments, the hard mask layer 124 is formed over the conductive material for the dummy gate electrode layer 122. In some embodiments, the hard mask layer 124 is used as an etching mask for forming the dummy gate structure 118. In some embodiments, the formation of the hard mask layer 124 includes forming an oxide layer 126 (e.g., silicon oxide) over the conductive material for dummy gate electrode layer 122, forming a nitride layer 128 (e.g., silicon nitride) over the oxide layer 126, and patterning the oxide layer 126 and the nitride layer 128 using photolithography and etching processes.

In some embodiments, the dielectric material for the dummy gate dielectric layer 120 and the conductive material for dummy gate electrode layer 122, uncovered by hard mask layer 124, are removed using one or more etching processes, thereby exposing the fin structures 104 in the source/drain regions 114. In some embodiments, the one or more etching processes are dry etching processes, wet etching processes, or a combination thereof.

A gate spacer layer 130 is formed over the substrate 102, as shown in FIGS. 2C-1 and 2C-2, in accordance with some embodiments. The gate spacer layer 130 is conformally formed along the upper surfaces of the fin structures 104 in the source/drain regions 114, the sidewalls of the dummy gate structure 118, and the sidewalls and the upper surface of the hard mask layer 124, in accordance with some embodiments.

In some embodiments, the gate spacer layer 130 is made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. In some embodiments, the gate spacer layer 130 is formed using CVD (such as LPCVD, PECVD, or sub-atmospheric CVD (SACVD)), ALD, another suitable method, and/or a combination thereof.

The gate spacer layer 130 formed along the upper surfaces of hard mask layer 124 and the fin structures 104 is removed, as shown in FIGS. 2D-1 and 2D-2, in accordance with some embodiments. After the removal process, the gate spacer layer 130, formed along the sidewalls of the dummy gate structure 118 and the hard mask layer 124, remains unremoved and forms a pair of gate spacer layers 130 on the opposite sides of the dummy gate structure 118, in accordance with some embodiments. The removal process includes a dry etching process, a wet etching process, and/or a combination thereof.

The fin structures 104 in the source/drain regions 114 are recessed to form source/drain recesses 132, as shown in FIGS. 2E-1 and 2E-2, in accordance with some embodiments. The source/drain recesses 132 is formed by etching the fin structures 104 uncovered by the gate spacer layers 130, the dummy gate structure 118, and the hard mask layer 124, in accordance with some embodiments. The source/drain recesses 132 pass through the upper portions 104U of the fin structures 104 and extend into the lower portion 104L of the fin structures 104, in accordance with some embodiments. In some embodiments, the etching process includes a dry etching process, a wet etching process, and/or a combination thereof.

Figures 1, 2, 2F:
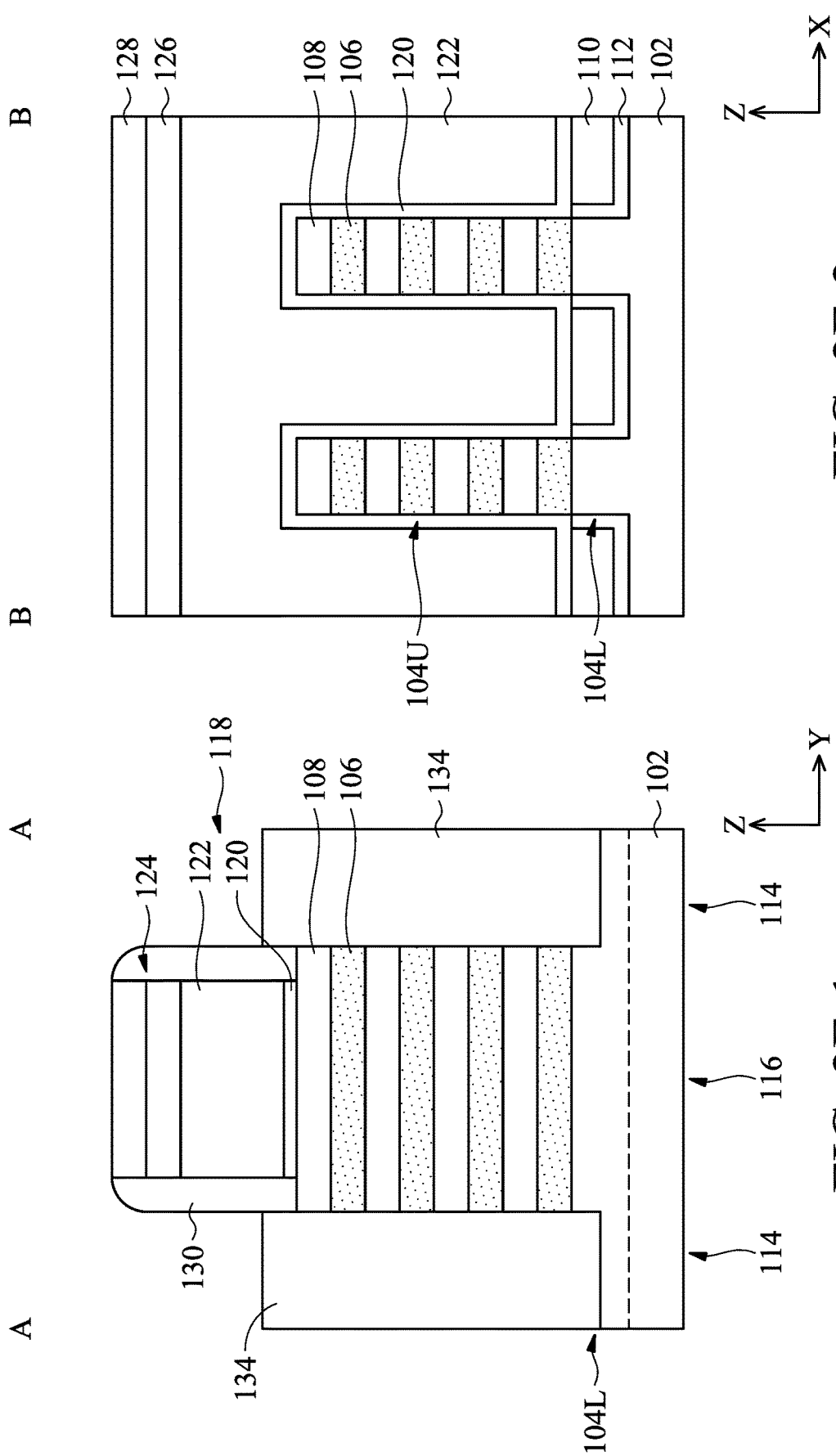

Source/drain features 134 are formed in the respective source/drain recesses 132, as shown in FIGS. 2F-1 and 2F-2, in accordance with some embodiments. The source/drain features 134 are formed over the exposed upper surface of the lower portions 104L of the fin structures 104, in accordance with some embodiments. The portion of the fin structure 104 covered by the gate spacer layers 130 and the dummy gate structure 118 is sandwiched between the source/drain features 134, in accordance with some embodiments.

In some embodiments, the source/drain features 134 are made of Ge, Si, GaAs, AlGaAs, SiGe, GaAsP, SiP, SiC, SiCP, another suitable material, and/or a combination thereof. In some embodiments, the source/drain features 134 are formed using epitaxial growth process, such as MBE, MOCVD, VPE, another suitable epitaxial growth process, and/or a combination thereof.

In some embodiments, the source/drain features 134 are in-situ doped during the epitaxial growth process. For example, the source/drain features 134 may be the epitaxially grown SiGe doped with boron (B). For example, the source/drain features 134 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the source/drain features 134 are doped in one or more implantation processes after the epitaxial growth process.

In some embodiments, the source/drain features 134 are activated by an annealing process. In some embodiments, the annealing processes include a rapid thermal annealing (RTA), a laser annealing process, other suitable annealing processed, and/or a combination thereof.

A contact etching stop layer (CESL) 136 is formed over the substrate 102, as shown in FIGS. 2G-1 and 2G-2, in accordance with some embodiments. The CESL 136 is conformally formed along the upper surface of the source/drain features 134, the sidewalls and the upper surfaces of the gate spacer layers 130, and the upper surface of the hard mask layer 124, in accordance with some embodiments.

In some embodiments, the CESL 136 is made of a dielectric material, such as silicon nitride, silicon oxide, silicon oxynitride, another suitable dielectric material, or a combination thereof. In some embodiments, the CESL 136 is formed using CVD (such as PECVD, HARP, and/or a combination thereof), ALD, another suitable method, and/or a combination thereof.

An interlayer dielectric (ILD) layer 138 is formed over the CESL 136, as shown in FIGS. 2H-1 and 2H-2, in accordance with some embodiments. In some embodiments, the ILD layer 138 is made of a dielectric material, such as tetraethylorthosilicate (TEOS) oxide, un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the dielectric material for the ILD layer 138 is formed over the CESL 136 using CVD (such as HDP-CVD, PECVD, or HARP), ALD, another suitable method, and/or a combination thereof.

Afterward, the dielectric material for the ILD layer 138, the CESL 136 and the hard mask layer 124 above the dummy gate structure 118 are planarized using such as CMP process or an etch-back process, in accordance with some embodiments. After the planarization process, the upper surface of the dummy gate electrode layer 122 is exposed, in accordance with some embodiments.

Figures 1, 2, 2I:
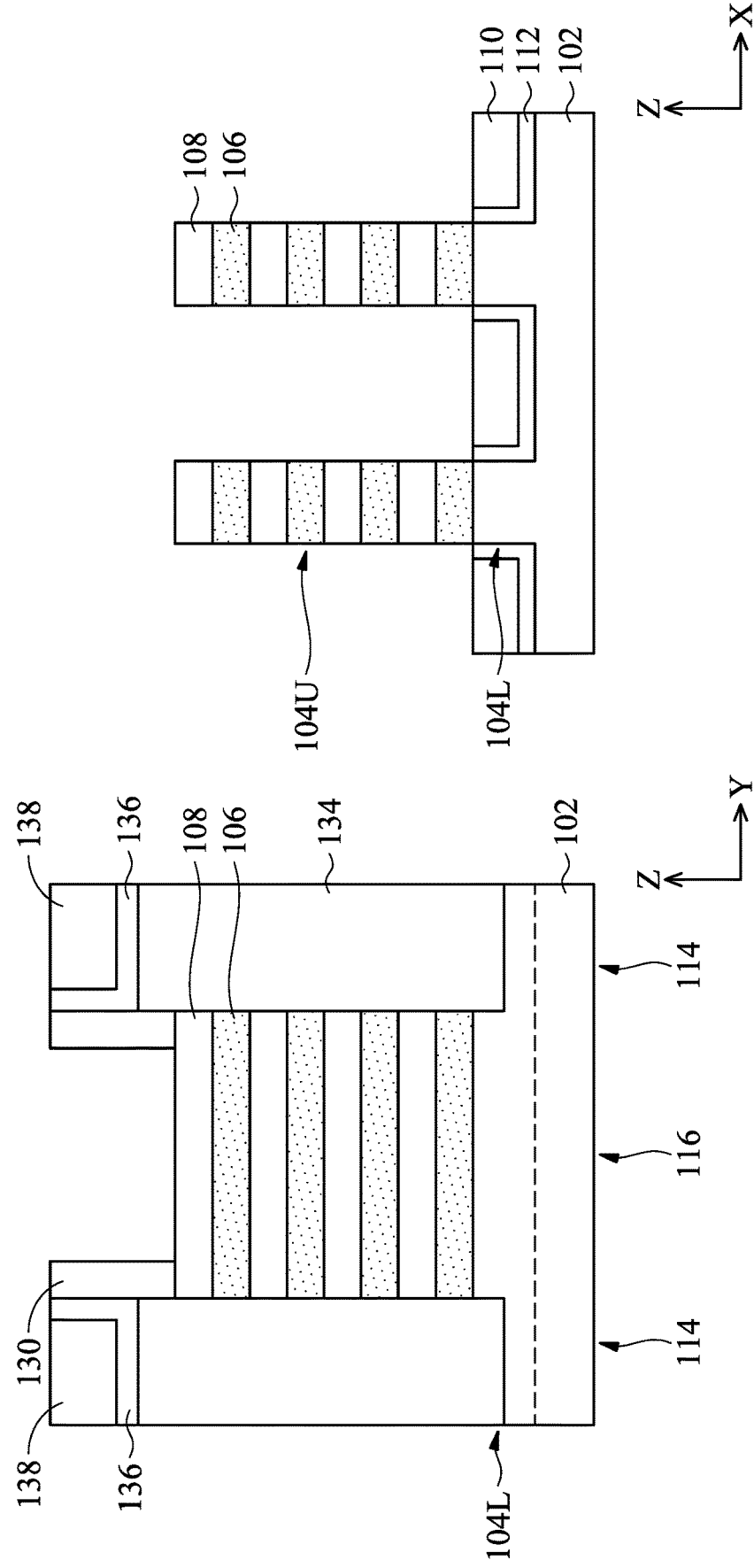

The dummy gate structure 118 including the dummy gate electrode layer 122 and the dummy gate dielectric layer 120 is removed, as shown in FIGS. 2I-1 and 2I-2, in accordance with some embodiments. After the dummy gate structure 118 is removed, the upper surfaces and the sidewalls of the upper portions 104U of the fin structures 104 in the channel regions 116 are exposed, in accordance with some embodiments.

In some embodiments, the removal process includes one or more etching processes. For example, when the dummy gate electrode layer 122 is polysilicon, a wet etchant such as a TMAH solution may be used to selectively remove the dummy gate electrode layer 122. For example, the dummy gate dielectric layer 120 may be thereafter removed using a plasma dry etching, a dry chemical etching, and/or a wet etching.

The first semiconductor layers 106 of the fin structures 104 are removed to form gaps 140, as shown in FIGS. 2J-1 and 2J-2, in accordance with some embodiments. The gaps 140 are formed in the channel region 116 and extend between the neighboring second semiconductor layers 108 and between the lowermost second semiconductor layer 108 and the lower portion 104L of the fin structure 104, in accordance with some embodiments. The gaps 140 laterally extend directly below the gate spacer layers 130, in accordance with some embodiments.

After the removal process, four main surfaces (an upper surface, two side surfaces, and a bottom surface) of each of the second semiconductor layers 108 are exposed, in accordance with some embodiments. The exposed second semiconductor layers 108 form a nanowire structure which will be surrounded by a gate stack, in accordance with some embodiments.

In some embodiments, the removal process includes a selective wet etching process, such as APM (e.g., ammonia hydroxide-hydrogen peroxide-water mixture) etching process. In some embodiments, the wet etching process uses etchants such as ammonium hydroxide ($NH_4OH$), tetramethylammonium hydroxide (TMAH), ethylenediamine pyrocatechol (EDP), and/or potassium hydroxide (KOH) solutions.

Native oxide layers 108N are formed on the main surfaces of the second semiconductor layers 108, as shown in FIGS. 2J-1 and 2J-2, in accordance with some embodiments. For example, during the removal process of the first semiconductor layers 106, the second semiconductor layers 108 may be oxidized to form the native oxide layers 108N. For example, after the removal process of the first semiconductor layers 106, the second semiconductor layers 108 may be oxidized to form the native oxide layers 108N because the second semiconductor layers 108 are exposed under an environment containing $O_2$ or $H_2O$.

A dielectric material 142 is formed over the substrate 102, as shown in FIGS. 2K-1 and 2K-2, in accordance with some embodiments. The dielectric material 142 is conformally formed along the upper surface of the ILD layer 138, the upper surface of the CESL 136, the upper surfaces and the sidewalls of the gate spacer layers 130, and the upper surface of the isolation structures 110, in accordance with some embodiments. The dielectric material 142 is also formed over the native oxide layers 108N and surrounds the four main surfaces of each of the second semiconductor layers 108, in accordance with some embodiments. The gaps 140 (shown in FIGS. 2J-1 and 2J-2) are entirely filled by the dielectric material 142, in accordance with some embodiments.

The dielectric material 142 is made of a dielectric material with k-value lower than 6, such as in a range from about 2.0 to about 6.0, in accordance with some embodiments. The dielectric material 142 is used to form inner spacer layers to reduce the parasitic capacitance between the gate stack and the source/drain feature, in accordance with some embodiments. If the k-value of the dielectric material 142 is too high, the dielectric material may not help reduce the parasitic capacitance.

In some embodiments, the dielectric material 142 is silicon oxycarbide (SiOC), silicon oxide carbonitride (SiOCN), silicon carbon nitride (SiCN), and/or a combination thereof, in accordance with some embodiments. For example, the dielectric material 142 may be represented as $Si_wO_xC_yN_z$, where w, x, y and z<1 and are the atomic percentages of Si, O, C and N, respectively. In some embodiments, the dielectric material 142 is formed using CVD (such as LPCVD, PECVD, SACVD, HARP, and/or FCVD), ALD, another suitable method, and/or a combination thereof.

The dielectric material 142 has a lower carbon concentration than the gate spacer layer 130, in accordance with some embodiments. In some embodiments, the carbon concentration the dielectric material 142 is at least about 2% lower than the carbon concentration of the gate spacer layer 130, for example, about 3%, or about 5% less. Due to the differentiated carbon concentration, the gate spacer layers 130 have little loss in a subsequent etching process for forming an inner spacer, in accordance with some embodiments.

For example, the gate spacer layer 130 may be silicon oxide carbonitride (SiOCN) and represented as the first material of $Si_wO_xC_yN_z$, where w is in a range from about 22.9 atomic % to about 32.9 atomic %; x is in a range from about 43.4 atomic % to about 53.4 atomic %; y is in a range from about 11.6 atomic % to about 21.6 atomic %; and z is in a range from about 3.1 atomic % to about 13.1 atomic %.

For example, the gate spacer layer 130 may be silicon oxide carbonitride (SiOCN) and represented as the second material of $Si_wO_xC_yN_z$, where w is in a range from about 27.3 atomic % to about 37.3 atomic %; x is in a range from about 26.7 atomic % to about 36.7 atomic %; y is in a range from about 5.0 atomic % to about 17.0 atomic %; and z is in a range from about 19.0 atomic % to about 29.0%.

For example, the dielectric material 142 may be silicon oxide carbonitride (SiOCN) and represented as the third material of $Si_wO_xC_yN_z$, where w is in a range from about 45.9 atomic % to about 55.9 atomic %; x is in a range from about 22.5 atomic % to about 32.5 atomic %; y is in a range from about 0.1 atomic % to about 10.1 atomic %; and z is in a range from about 12.3 atomic % to about 22.3 atomic %.

For example, the dielectric material 142 may be silicon oxide carbonitride (SiOCN) and represented as the fourth material of $Si_wO_xC_yN_z$, where w is in a range from about 24.0 atomic % to about 34.0 atomic %; x is in a range from about 40.9 atomic % to about 50.9 atomic %; y is in a range from about 8.3 atomic % to about 18.3 atomic %; and z is in a range from about 6.8 atomic % to about 16.8 atomic %.

For example, the dielectric material 142 may be silicon oxycarbide (SiOC) and represented as the fifth material of $Si_wO_xC_yN_z$, where w is in a range from 24.0 atomic % to about 34.0 atomic %; x is in a range from about 55.2 atomic % to about 65.2 atomic %; y is in a range from about 5.1 atomic % to about 15.1 atomic %; and z is in a range from about 0.1 atomic % to about 5.0 atomic %.

For example, when the gate spacer layer 130 is the first material of SiOCN, the dielectric material 142 may be the third material, the fourth material, or the fifth material of SiOCN. For example, when the gate spacer layer 130 is the second material of SiOCN, the dielectric material 142 may be the third material or the fifth material of SiOCN.

In some embodiments, as measured in the X direction, the second semiconductor layer 108 has a dimension D1 in a range from about 5 nm to about 50 nm. In some embodiments, as measured in the Z direction, the second semiconductor layer 108 has a dimension D2 in a range from about 4 nm to about 10 nm. In some embodiments, as measured in the Z direction, the spacing between neighboring second semiconductor layers 108 is a dimension D3 in a range from about 1.5 nm to about 10 nm.

In some embodiments, as measured in the X direction, the dielectric material 142 formed along the side surface of the second semiconductor layer 108 has a maximum thickness D4 in a range from about 1 nm to about 5 nm. In some embodiments, as measured in the X direction, the dielectric material 142 formed between neighboring second semiconductor layers 108 has a minimum thickness D5 in a range from about 8 nm to about 16 nm.

In some embodiments, as measured in the Y direction, the dielectric material 142 formed along the sidewall of the gate spacer layer 130 has a thickness D6 in a range from about 1 nm to about 5 nm. In some embodiments, as measured in the Y direction, the spacing between the dielectric material 142 formed along the respective sidewalls of the opposite gate spacer layers 130 is a dimension D7 in a range from about 6 nm to about 20 nm.

Figures 1, 2, 2N:
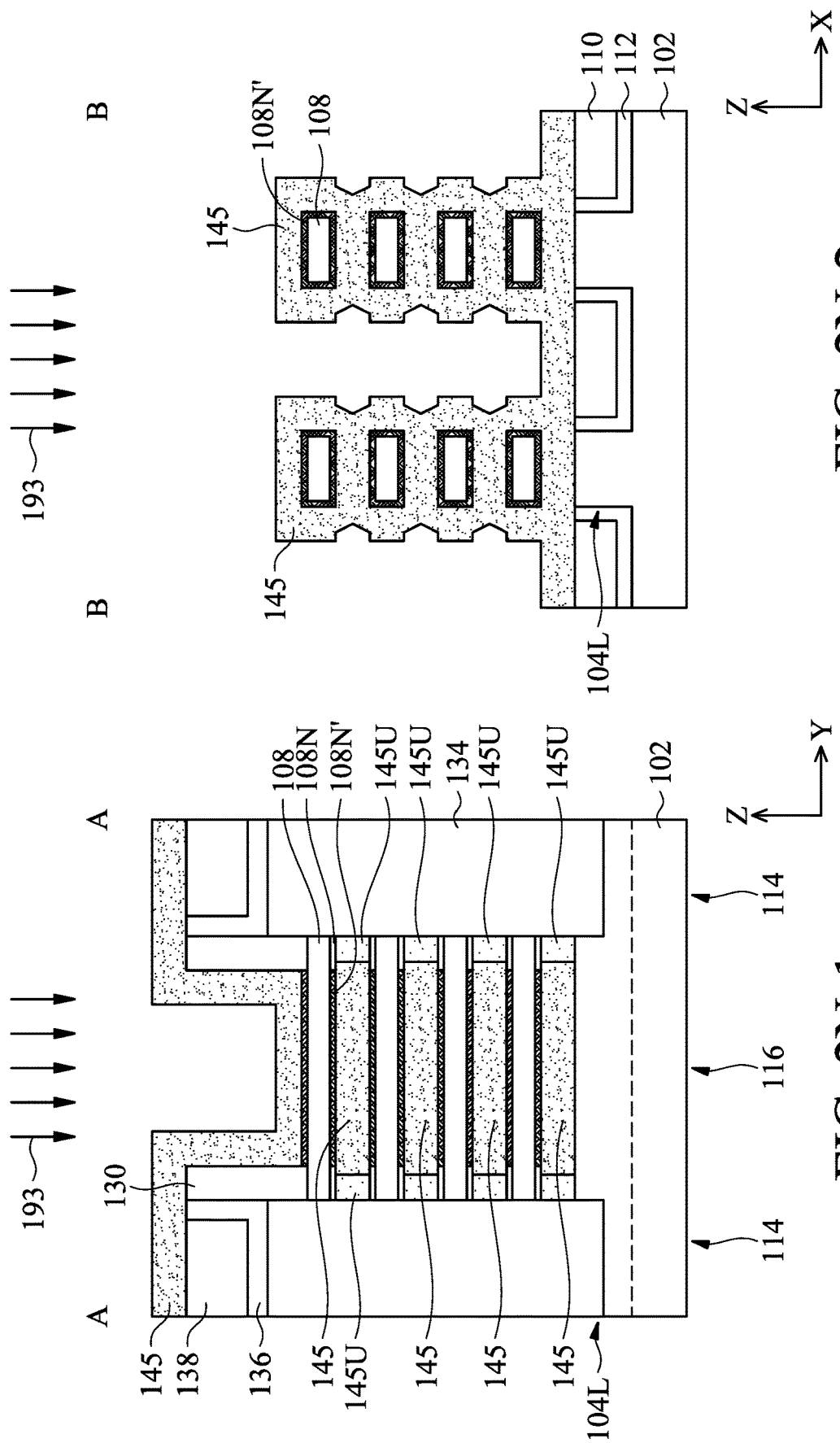

FIGS. 2L-1, 2L-2, 2M-1, 2M-2, 2N-1 and 2N-2 illustrate treatment processes performed on the dielectric material 142, in accordance with some embodiments. After the treatment processes, the dielectric material 142 has a treated portion 145 and an untreated portion 145U, as shown in FIGS. 2N-1 and 2N-2, in accordance with some embodiments. Because an etching selectivity exists between the treated portion 145 and the untreated portion 145U, a subsequent etching process selectively removes the treated portion 145 of the dielectric material 142 and remains the untreated portion 143U as inner spacer layers, in accordance with some embodiments. The treatment processes of the dielectric material 142 are described in detail below.

The dielectric material 142 is treated using a first treatment process 191, as shown in FIGS. 2L-1 and 2L-2, in accordance with some embodiments. It should be noted that FIG. 2L-1 is taken along line C-C in FIG. 2L-2. The outer portion of the dielectric material 142 is treated and is referred to as a first treated portion 143 while an inner portion of the dielectric material 142 remains untreated and is referred to as an untreated portion 143U, in accordance with some embodiments.

The first treated portion 143, which is formed in the channel region 116, is in direct contact with the native oxide layers 108N, as shown in FIG. 2L-2, in accordance with some embodiments. The native oxide layer 108N, which is formed on the upper surface and the side surfaces of the uppermost second semiconductor layer 108, is entirely covered by the first treated portion 143, in accordance with some embodiments. The native oxide layer 108N, which is formed on the side surfaces of the each of the lower three semiconductor layers 108, is entirely covered by the first treated portion 143, in accordance with some embodiments.

A peripheral area of the bottom surface of the uppermost second semiconductor layer 108 is covered by the first treated portion 143 while a center area of the bottom surface of the uppermost second semiconductor layer 108 is covered by the untreated portion 143U, as shown in FIG. 2L-2, in accordance with some embodiments. Peripheral areas of the upper surface and the bottom surface of each of the lower three semiconductor layers 108 are covered by the first treated portion 143 while center areas of the upper surface and the bottom surface of each of the lower three second semiconductor layers 108 are covered by the untreated portion 143U, in accordance with some embodiments.

The first treated portion 143, which is formed in the channel region 116, extends between neighboring second semiconductor layers 108 and between the lowermost second semiconductor layer 108 and the lower portion 104L, as shown in FIG. 2L-1, in accordance with some embodiments. The dielectric material 142, which is formed along the upper surfaces of the ILD layer 138 and the CESL 136, and the upper surfaces and the sidewalls of the gate spacer layers 130, is also treated and forms the first treated portion 143, as shown in FIG. 2L-1, in accordance with some embodiments.

Because of the shielding of the gate spacer layers 130, the untreated portion 143U remains in the source/drain regions 114 and is located on the source/drain features 134, in accordance with some embodiments.

The first treatment process 191 oxidizes the dielectric material 142 to consume carbon in the dielectric material 142 and increase oxygen in the dielectric material 142, in accordance with some embodiments. The first treatment process 191 is a remote plasma process, which is performed in an etching tool equipped with a remote plasma system (RPS), in accordance with some embodiments.

The first treatment process 191 uses oxidizing gases including $H_2O$ and $O_2$ gases, in accordance with some embodiments. In some embodiments, a flow rate of $H_2O$ is in a range from about 50 sccm to about 3000 sccm, and a flow rate of $O_2$ is in a range from about 50 sccm to about 3000 sccm. When passing through the RPS, the oxidizing gases may be formed into radicals. In some embodiments, the RF power of the plasma generator of the RPS is in a range from about 20 W to about 9000 W.

Afterward, the radicals are introduced into the etching chamber to the substrate 102 so as to oxidize the dielectric material 142, in accordance with some embodiments. The charged species (such ion) generated from plasma generators are filtered using ground electrode material (such as Aluminum), ion trap material (such as Quartz), or another suitable material, and thus only radicals are formed in the etching chamber, in accordance with some embodiments. The first treatment process 191 treats the dielectric material 142 isotropically, in accordance with some embodiments. In some embodiments, the first treatment process 191 is performed in the etching chamber with a pressure ranging from about 0.1 Torr to about 15 Torr, and with a temperature in a range from about 20° C. to about 600° C. In some embodiments, the first treatment process 191 is performed for a first time period in a range from about 10 seconds to about 900 seconds.

During the first treatment process 191, the first treated portion 143 is formed from the outer surface of the dielectric material 142 and grown into the interior of the dielectric material 142, as shown in FIG. 2L-2, in accordance with some embodiments. The first treatment process 191 is performed until the first treated portion 143 is grown to contact the native oxide layers 108N in order to prevent further growth of the native oxide layers 108N due to the first treatment process 191, in accordance with some embodiments. Further growth of the native oxide layers 108N would consume the second semiconductor layers 108, resulting in shrinkage of the nanowire structure.

In some embodiments, as measured in the X direction, the first treated portion 143 has a thickness D8 in a range from about 1 nm to about 5 nm. In some embodiments, thickness D8 is substantially equal to thickness D4.

The dielectric material 142 and the native oxide layers 108N are treated using a second treatment process 192, as shown in FIGS. 2M-1 and 2M-2, in accordance with some embodiments. It should be noted that FIG. 2M-1 is taken along line C-C in FIG. 2M-2. The outer portion of the untreated portion 143U is treated and forms a second treated portion 144 while the inner portion of the untreated portion 143U remains untreated and is referred to as the untreated portion 144U, as shown in FIG. 2M-2, in accordance with some embodiments. The native oxide layers 108N treated by the second treatment process 192 are labeled 108N'.

A middle portion of the bottom surface of the uppermost second semiconductor layer 108 is covered by the second treated portion 144, as shown in FIG. 2L-2, in accordance with some embodiments. Middle portions the upper surface and the bottom surface of each of the lower three semiconductor layers 108 are covered by the second treated portion 144, in accordance with some embodiments.

The second treated portion 144, which is formed in the channel region 116, extends between neighboring second semiconductor layers 108 and between the lowermost second semiconductor layer 108 and the lower portion 104L, as shown in FIG. 2M-1, in accordance with some embodiments.

Because of the shielding of the gate spacer layers 130, the untreated portion 144U remains in the source/drain regions 114 and is located on the source/drain features 134, as shown FIG. 2M-1, in accordance with some embodiments.

The second treatment process 192 nitridizes the dielectric material 142 and the native oxide layers 108N, in accordance with some embodiments. The nitrided native oxide layers 108N' will not be further grown in a following oxidation treatment process and serve as a passivation layer to prevent the second semiconductor layers 108 from being consumed in the following oxidation treatment process, in accordance with some embodiments. The second treatment process 192 is a remote plasma process, in accordance with some embodiments. For example, the second treatment process 192 may be performed in the same etching tool as the first treatment process 191.

The second treatment process 192 uses nitriding gas including $NH_3$ gas, in accordance with some embodiments. In some embodiments, a flow rate of $NH_3$ is in a range from about 50 sccm to about 3000 sccm. When passing through the RPS, the nitriding gas may be formed into radicals. In some embodiments, the RF power of the plasma generator of the RPS is in a range from about 20 W to about 9000 W.

Afterward, the radicals are introduced into the etching chamber to the substrate 102 so as to nitridize the dielectric material 142 and the native oxide layers 108N, in accordance with some embodiments. The charged species (such ion) generated from plasma generators are filtered using ground electrode material (such as Aluminum), ion trap material (such as Quartz), or another suitable material, and thus only radicals are formed in the etching chamber, in accordance with some embodiments. In some embodiments, the second treatment process 192 is performed in the etching chamber with a pressure ranging from about 0.1 Torr to about 15 Torr, and with a temperature in a range from about 20° C. to about 600° C. In some embodiments, the second treatment process 192 is performed for a second time period in a range from about 10 seconds to about 900 seconds.

In some embodiments, as measured in the X direction, the first treated portion 143 together with the second treated portion 144 has a thickness D9 in a range from about 2 nm to about 7 nm.

The dielectric material 142 is treated using a third treatment process 193, as shown in FIGS. 2N-1 and 2N-2, in accordance with some embodiments. The inner portion (including the second treated portion 144 and the untreated portion 144U (shown in FIG. 2M-2)) of the dielectric material 142 in the channel region 116 is entirely treated and the inner portion together with the first treated portion 143 are referred to as a treated portion 145, in accordance with some embodiments. Moreover, the first treated portion 143, formed along the upper surfaces of the ILD layer 138 and the CESL 136, and the upper surfaces and the sidewalls of the gate spacer layers 130, is also referred to as the treated portion 145.

The treated portion 145, which is formed in the channel region 116, extends between neighboring second semiconductor layers 108 and between the lowermost second semiconductor layer 108 and the lower portion 104L, as shown FIG. 2N-1, in accordance with some embodiments. In some embodiments, the treated portion 145 extends further into the source/drain regions 114 and directly below the gate spacer layer 130.

Because of the shielding of the gate spacer layers 130, the dielectric material 142, which is formed in the source/drain regions 114, remains untreated and is referred to as the untreated portion 145U, as shown FIG. 2N-1, in accordance with some embodiments. The untreated portion 145U is located on the source/drain feature 134, in accordance with some embodiments.

The third treatment process 193 oxidizes the dielectric material 142 to consume the carbon in the dielectric material 142 and increase oxygen in the dielectric material 142, in accordance with some embodiments. The third treatment process 193 is a remote plasma process, in accordance with some embodiments. For example, the third treatment process 193 may be performed in the same etching tool as the first treatment process 191.

The third treatment process 193 uses oxidizing gases including $H_2O$ and $O_2$ gases, in accordance with some embodiments. The nitrided native oxide layers 108N' is not further grown in the third treatment process 193. In some embodiments, a flow rate of $H_2O$ is in a range from about 50 sccm to about 3000 sccm, and a flow rate of $O_2$ is in a range from about 50 sccm to about 3000 sccm. When passing through the RPS, the oxidizing gases may be formed into radicals. In some embodiments, the RF power of the plasma generator of the RPS is in a range from about 20 W to about 9000 W.

Afterward, the radicals are introduced into the etching chamber to the substrate 102 so as to oxidize the dielectric material 142, in accordance with some embodiments. The charged species (such ion) generated from plasma generators are filtered using ground electrode material (such as Aluminum), ion trap material (such as Quartz), or another suitable material so that only radicals are formed in the etching chamber, in accordance with some embodiments. In some embodiments, the third treatment process 193 is performed in the etching chamber with a pressure ranging from about 0.1 Torr to about 15 Torr, and with a temperature in a range from about 20° C. to about 600° C. In some embodiments, the third treatment process 193 is performed for a third time period in a range from about 10 seconds to about 900 seconds. In order to treat the entire inner portion of the dielectric material 142 in the channel region 116, the RF power, temperature, pressure, and/or time period of the third treatment process 193 is greater than that of the first treatment process 191, in accordance with some embodiments.

The carbon in the dielectric material 142 is consumed by the oxidizing gases during the first treatment process 191 and third treatment process 193, thus the carbon concentration of the treated portion 145 is lower than that of the untreated portion 145U, in accordance with some embodiments. The oxygen concentration of the treated portion 145 is greater than that of the untreated portion 145U, in accordance with some embodiments. The treated portion 145 is a more oxide-like dielectric material compared to the untreated portion 145U, in accordance with some embodiments. In some embodiments, the carbon concentration of the treated portion 145 is at least about 3.0 atomic % lower than that of the untreated portion 145U, for example, about 5.0 atomic %, or about 10.0 atomic % less.

The treated portion 145 is removed to form gaps 146, as shown in FIGS. 2O-1 and 2O-2, in accordance with some embodiments. The removal process includes a selective etching process, in accordance with some embodiments. The selective etching process removes the treated portion 145 of the dielectric material 142 and remains the untreated portion 145U of the dielectric material 142 as inner spacer layers 148, in accordance with some embodiments.

The inner spacer layers 148 are formed in the source/drain regions 114 and on the source/drain features 134, in accordance with some embodiments. The inner spacer layers 148 are formed between neighboring second semiconductor layers 108 and between the lowermost second semiconductor layer 108 and the lower portion 104L, in accordance with some embodiments.

In some embodiments, as measured in the Y direction, the inner spacer layer 148 has a dimension D10 in a range from about 2.0 nm to about 9.0 nm. In some embodiments, as measured in the Y direction, the gate spacer layer 130 has a dimension D11 in a range from about 3.0 nm to about 16.0 nm. The gate spacer layer 130 laterally extends beyond an edge of the inner spacer layer 148 in the Y direction by a distance D12, in accordance with some embodiments. In some embodiments, the distance D12 is in a range from about 1.0 nm to about 7.0 nm.

In some embodiments, the selective etching process of removing the treated portion 145 includes a wet etch process, a dry etch process, or a combination thereof. In some embodiments, the selective etching process is a plasma-free dry chemical etching process and isotropically etches the dielectric material 142, in accordance with some embodiments. In some embodiments, the etchant of the dry chemical etching process includes radicals, such as HF, $NF_3$, $NH_3$, $H_2$, and/or a combination thereof.

Due to the differentiated carbon concentration, an etching selectivity exists between the treated portion 145 and the untreated portion 145U in the etching process, in accordance with some embodiments. In some embodiments, the ratio of the etching rate of the treated portion 145 to the etching rate of the untreated portion 145U is in a range from about 5 to about 100. As a result, the etching process can be well controlled to remove the treated portion 145 entirely and remain the untreated portion 145U as the inner spacer layers 148, in accordance with some embodiments.

In addition, in order to entirely remove the treated portion 145, the etching process includes an over-etching step, in accordance with some embodiments. In the over-etching step, the etchants also etch the gate spacer layers 130, in accordance with some embodiments. Due to the differentiated carbon concentration, an etching selectivity also exists between the treated portion 145 and the gate spacer layers 130 in the etching process, in accordance with some embodiments. In some embodiments, the ratio of the etching rate of the treated portion 145 to the etching rate of the gate spacer layer 130 is in a range from 5 to about 100. As a result, loss of the gate spacer layer 130 in the etching process of removing the treated portion 145 can be decreased, thereby maintaining the performance of the semiconductor device 100, in accordance with some embodiments.

Afterward, the native oxide layers 108 and 108N', uncovered by the inner spacer layers 148, are removed using an etching process, thereby exposing the main surfaces of the second semiconductor layers 108, in accordance with some embodiments.

A gate stack 150 is formed in the channel region 116, as shown in FIGS. 2P-1 and 2P-2, in accordance with some embodiments. The gate stack 150 extends in the X direction, in accordance with some embodiments. The gate stack 150 fills the gaps 146 (shown in FIGS. 2O-1 and 2O-2) and surrounds the second semiconductor layers 108, in accordance with some embodiments. The gate stack 150 extends into the source/drain regions 114 and in contact with the inner spacer layers 148, in accordance with some embodiments.

The gate stack 150 includes an interfacial layer 152, a high-k dielectric layer 154, and a gate electrode layer 156, in accordance with some embodiments. The interfacial layer 152 is conformally formed along the main surfaces of the second semiconductor layers 108 to surround the second semiconductor layers 108, in accordance with some embodiments. The interfacial layer 152 is conformally formed along the upper surface of the ILD layer 138, the upper surface of the CESL 136, the upper surfaces and the sidewalls of the gate spacer layers 130, and the sidewalls of the inner spacer layers 148, in accordance with some embodiments. In some embodiments, the interfacial layer 152 is made of a chemically formed silicon oxide.

The high-k dielectric layer 154 is formed on the interfacial layer 152, in accordance with some embodiments. In some embodiments, the high-k gate dielectric layer 154 is made of one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, another suitable high-k dielectric material, and/or a combination thereof. In some embodiments, the high-k gate dielectric layer 154 is formed using CVD, ALD, another suitable method, and/or a combination thereof.

The gate electrode layer 156 is formed on the high-k dielectric layer 154, in accordance with some embodiments. The gate electrode layer 156 fills the gaps 146, in accordance with some embodiments. In some embodiments, the gate electrode layer 156 is made of one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, and/or a combination thereof. In some embodiments, the gate electrode layer 156 is formed using CVD, ALD, electroplating, another suitable method, and/or a combination thereof.

Afterward, the gate structure 150, which is formed above the upper surface of the ILD layer 138, is planarized using such as CMP to expose the upper surface of the ILD layer 138, in accordance with some embodiments. After the gate stack 150 is formed, the semiconductor device 100 is obtained.

The inner spacer layer 148, formed between the source/drain feature 134 and the gate stack 150, can reduce the parasitic capacitance between the gate stack and the source/drain feature (i.e. Cgs and Cgd), in accordance with some embodiments. As a result, the performance of the semiconductor device structure 100 can be increased.

In addition, the formation of the inner spacer layer 148 includes locally treating the dielectric material 142, in accordance with some embodiments. Because an etching selectivity exists between the treated portion 145 and the untreated portion 145U of the dielectric material 142, the etching process can be well controlled to entirely remove the treated portion 145, thereby leaving the untreated portion 145U to serve as the inner spacer layers 148. Without locally treating the dielectric material 142, it will be difficult to control the formation of the inner spacer layers 148 on the desired region while entirely removing the dielectric material 142 formed on the semiconductor layers 108 and gate spacer layers 130. Thus, the process window of the formation of the inner spacer layer 148 can be enhanced.

In the embodiments shown in FIGS. 2K-1 through 2O-2, the treatment processes 191, 192 and 193 locally treat the dielectric material 142 into an oxide-like dielectric material. In the embodiments shown in FIGS. 3A-1 through 3D-2, treatment processes 291 and 292 locally treat a dielectric material 242 into a nitride-like dielectric material.

Figures 2, 3A:
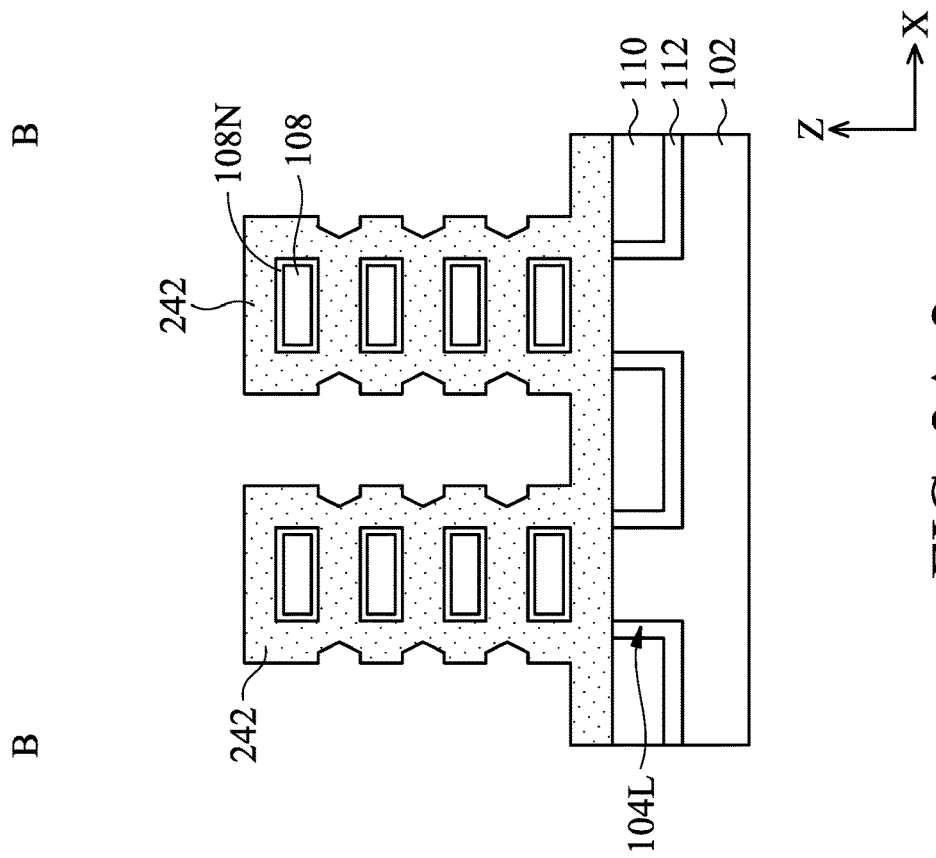
Figures 1, 3A:
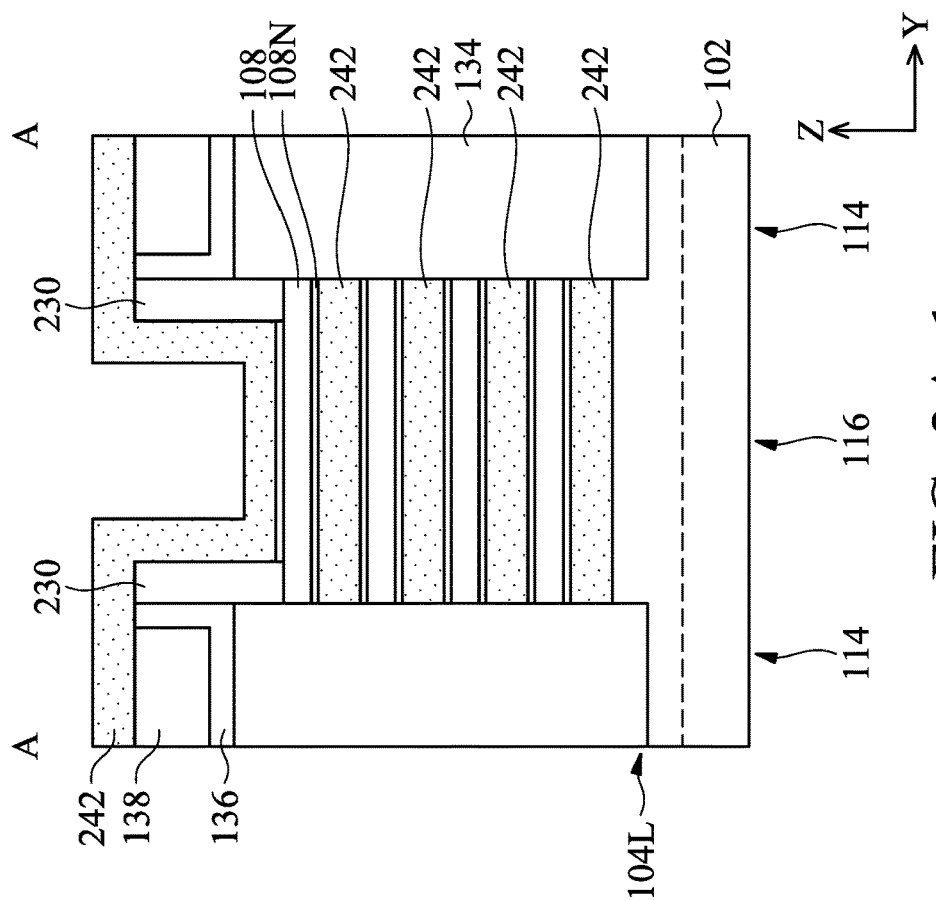
Figures 1, 3D:
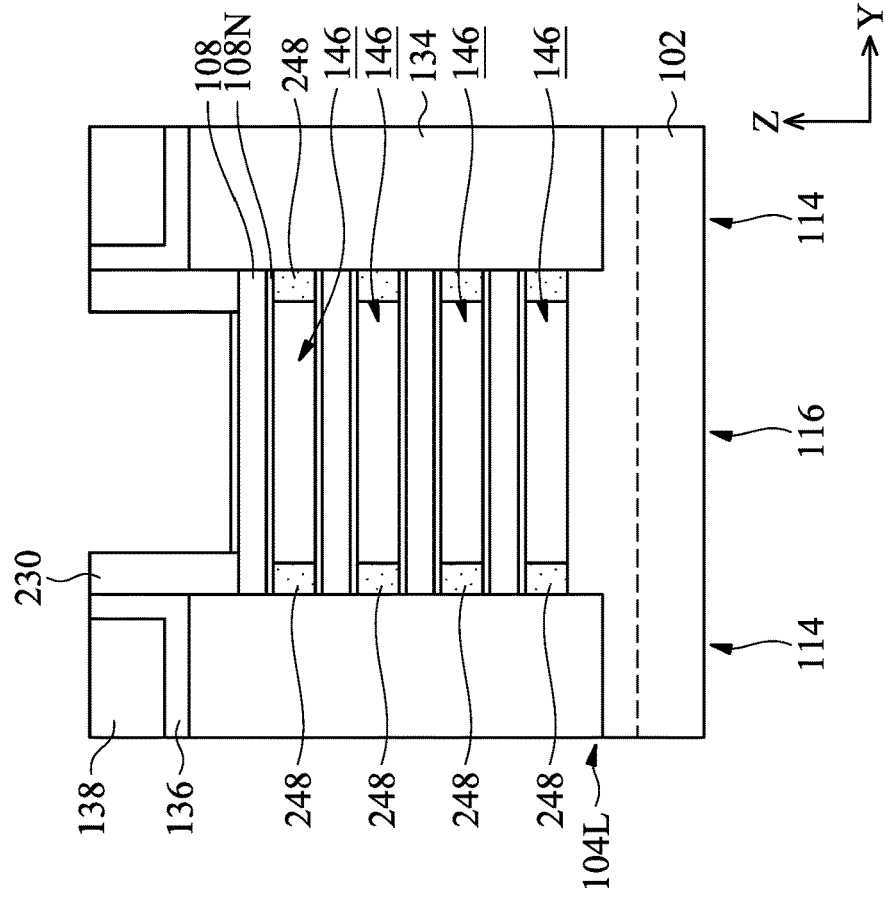
Figures 2, 3D:
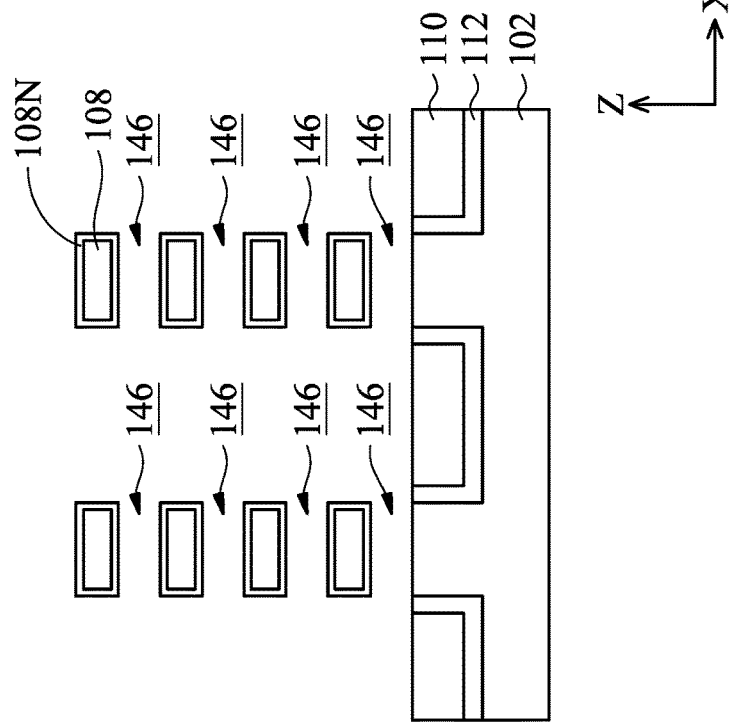

FIGS. 3A-1 through 3D-1 are cross-sectional views illustrating the formation of an inner spacer layer 248 along line A-A in FIG. 1 at various intermediate stages, in accordance with some embodiments. FIGS. 3A-2 through 3D-2 are cross-sectional views illustrating the formation of the inner spacer layer 248 along line B-B in FIG. 1 at various intermediate stages, in accordance with some embodiments.

Continuing from FIGS. 2J-1 and 2J-2, a dielectric material 242 is formed over the substrate 102, as shown in FIGS. 3A-1 and 3A-2, in accordance with some embodiments. The dielectric material 242 is conformally formed along the upper surface of the ILD layer 138, the upper surface of the CESL 136, the upper surfaces and the sidewalls of the gate spacer layers 230, and the upper surface of the isolation structures 110, in accordance with some embodiments. The dielectric material 242 is formed over the native oxide layers 108N and surrounds the four main surfaces of each of the second semiconductor layers 108, in accordance with some embodiments. The gaps 140 (shown in FIGS. 2J-1 and 2J-2) are entirely filled by the dielectric material 242, in accordance with some embodiments.

The dielectric material 242 has a nitrogen concentration greater than the nitrogen concentration of the gate spacer layer 230, in accordance with some embodiments. In some embodiments, the nitrogen concentration of the dielectric material 242 is at least about 2% greater than the gate spacer layer 230, for example, about 3%, about 5% greater. Due to the differentiated nitrogen concentration, the gate spacer layer 230 has little loss in a subsequent etching process for forming an inner spacer, in accordance with some embodiments.

For example, the gate spacer layer 230 may be silicon carbon nitride (SiCN) and represented as the sixth material of $Si_wO_xC_yN_z$, where w is in a range from about 32.0 atomic % to about 42.0 atomic %; x is in a range from about 7.6 atomic % to about 17.6 atomic %; y is in a range from about 1.4 atomic % to about 11.4 atomic %; and z is in a range from about 39.0 atomic % to about 49.0 atomic %.

For example, the dielectric material 242 may be silicon carbon nitride (SiCN) and represented as the seventh material of $Si_wO_xC_yN_z$, where w is in a range from about 34.0 atomic % to about 44.0 atomic %; x is in a range from about 3.8 atomic % to about 13.8 atomic %; y is in a range from about 0.5 atomic % to about 6.0 atomic %; and z is in a range from about 45.5 atomic % to about 55.5 atomic %.

For example, when the gate spacer layer 230 is the sixth material of SiOCN, the dielectric material 242 may be the seventh material of SiOCN.

The dielectric material 242 is treated using a first treatment process 291, as shown in FIGS. 3B-1 and 3B-2, in accordance with some embodiments. It should be noted that FIG. 3B-1 is taken along line C-C in FIG. 3B-2. The outer portion of the dielectric material 242 is treated and is referred to as the first treated portion 243 while the inner portion of the dielectric material 242 remains untreated and is referred to as the untreated portion 243U, in accordance with some embodiments.

The profile of the first treated portion 243 is substantially the same as that of the first treated portion 143 as previously described and as illustrated in FIGS. 2L-1 and 2L-2, in accordance with some embodiments. For example, the first treated portion 243, which is formed in the channel region 116, is in direct contact with the native oxide layers 108N, as shown in FIG. 3B-2, in accordance with some embodiments. For example, because of the shielding of the gate spacer layers 230, the untreated portion 243U remains in the source/drain regions 114 and is located on the source/drain features 134, in accordance with some embodiments.

The first treatment process 291 nitridizes the dielectric material 242 to consume carbon in the dielectric material 242 and increase nitrogen in the dielectric material 242, in accordance with some embodiments. The first treatment process 291 is a remote plasma process, which is performed in an etching tool equipped with a remote plasma system (RPS), in accordance with some embodiments.

The first treatment process 291 uses nitriding gases including $NH_3$ gas, in accordance with some embodiments. In some embodiments, a flow rate of $NH_3$ is in a range from about 50 sccm to about 3000 sccm. When passing through the RPS, the nitriding gas may be formed into radicals. In some embodiments, a first RF power of the plasma generator of the RPS is in a range from about 20 W to about 9000 W.

Afterward, the radicals are introduced into the etching chamber to the substrate 102 so as to nitridize the dielectric material 242, in accordance with some embodiments. The charged species (such ion) generated from plasma generators are filtered using ground electrode material (such as Aluminum), ion trap material (such as Quartz), or another suitable material, and thus only radicals are formed in the etching chamber, in accordance with some embodiments. In some embodiments, the first treatment process 291 is performed in the etching chamber with a pressure ranging from about 0.1 Torr to about 15 Torr, and with a temperature in a range from about 20° C. to about 600° C. In some embodiments, the first treatment process 291 is performed for a first time period in a range from about 10 seconds to about 900 seconds.

The first treatment process 291 is performed until the first treated portion 243 is grown to contact the native oxide layers 108N in order to prevent the second semiconductor layers 108 from being nitrided, as shown in FIG. 3B-2, in accordance with some embodiments. For example, the nitridation of the second semiconductor layers 108 may consume the second semiconductor layers 108, resulting in shrinkage of the nanowire structure.

The dielectric material 242 is treated using a second treatment process 292, as shown in FIGS. 3C-1 and 3C-2, in accordance with some embodiments. The inner portion (including the untreated portion 243U (shown in FIG. 3B-2)) of the dielectric material 242 in the channel region 116 is entirely treated and the inner portion together with the first treated portion 243 are referred to as a treated portion 245, in accordance with some embodiments. Moreover, the first treated portion 243, formed along the upper surfaces of the ILD layer 138 and the CESL 136, and the upper surfaces and the sidewalls of the gate spacer layers 230, is also referred to as a treated portion 245.

The treated portion 245, which is formed in the channel region 116, extends between neighboring second semiconductor layers 108 and between the lowermost second semiconductor layer 108 and the lower portion 104L, as shown FIG. 3C-1, in accordance with some embodiments. In some embodiments, the treated portion 245 extends further into the source/drain regions 114 and directly below the gate spacer layer 230.

Because of the shielding of the gate spacer layers 230, the dielectric material 242, which is formed in the source/drain regions 114, remains untreated and is referred to as the untreated portion 245U. The untreated portion 245U is located on the source/drain feature 134, in accordance with some embodiments.

The second treatment process 292 nitridizes the dielectric material 242 to consume the carbon in the dielectric material 242 and increase nitrogen in the dielectric material 242, in accordance with some embodiments. The second treatment process 292 is a remote plasma process, in accordance with some embodiments. For example, the remote plasma process may be performed in the same etching tool as the first treatment process 291.

The second treatment process 292 uses nitriding gas including $NH_3$ gas, in accordance with some embodiments. In some embodiments, a flow rate of $NH_3$ is in a range from about 50 sccm to about 3000 sccm. When passing through the RPS, the nitriding gas may be formed into radicals. In some embodiments, the second RF power of the plasma generator of the RPS is in a range from about 20 W to about 9000 W. In order to treat the entire inner portion of the dielectric material 242 in the channel region 116 without nitriding the semiconductor layers 108, the RF power, temperature, and/or pressure of the plasma generator of the RPS is lower than that of the first treatment process 291, in accordance with some embodiments.

Afterward, the radicals are introduced into the etching chamber to the substrate 102 so as to nitridize the dielectric material 242, in accordance with some embodiments. The charged species (such ion) generated from plasma generators are filtered using ground electrode material (such as Aluminum), ion trap material (such as Quartz), or another suitable material, and thus only radicals are formed in the etching chamber, in accordance with some embodiments. In some embodiments, the second treatment process 292 is performed in the etching chamber with a pressure ranging from about 0.1 Torr to about 15 Torr, and with a temperature in a range from about 20° C. to about 600° C. In some embodiments, the second treatment process 292 is performed for a second time period in a range from about 10 seconds to about 900 seconds. In order to treat the entire inner portion of the dielectric material 242 in the channel region 116, the second time period of the second treatment process 292 is greater than the first time period of the first treatment process 291, in accordance with some embodiments.

The nitrogen in the dielectric material 242 is increased by the nitriding gases during the first treatment process 291 and second treatment process 292, thus the nitrogen concentration of the treated portion 245 is greater than that of the untreated portion 245U, in accordance with some embodiments. The treated portion 245 is a more nitride-like dielectric material compared to the untreated portion 245U, in accordance with some embodiments. In some embodiments, the nitrogen concentration of the treated portion 245 is at least about 3.0 atomic % greater than that of the untreated portion 245U, for example, about 5.0 atomic %, or about 10.0 atomic % greater.

The treated portion 245 is removed to form gaps 146, as shown in FIGS. 3D-1 and 3D-2, in accordance with some embodiments. The removal process includes a selective etching process, in accordance with some embodiments. The selective etching process removes the treated portion 245 of the dielectric material 242 and remains the untreated portion 245U of the dielectric material 242 as inner spacer layers 248, in accordance with some embodiments.

In some embodiments, the selective etching process of removing the treated portion 245 includes a wet etch process, a dry etch process, or a combination thereof. In some embodiments, the selective etching process is a plasma-free dry chemical etching process and isotropically etches the dielectric material 242, in accordance with some embodiments. In some embodiments, the etchants of the dry chemical etching process includes radicals, such as HF, $NH_3$, $NF_3$, $O_2$, $N_2O$, $H_2$, $Cl_2$, $Br_2$, HCl, HBr, and/or a combination thereof.

Due to the differentiated nitrogen concentration, an etching selectivity exists between the treated portion 245 and the untreated portion 245U in the etching process, in accordance with some embodiments. In some embodiments, the ratio of the etching rate of the treated portion 245 to the etching rate of the untreated portion 245U is in a range from about 5 to about 100. As a result, the etching process can be well controlled to remove the treated portion 245 entirely and remain the untreated portion 245U as the inner spacer layer 248, in accordance with some embodiments.

In some embodiments, the ratio of the etching rate of the treated portion 245 to the etching rate of the gate spacer layer 230 is in a range from 5 to about 100. As a result, loss of the gate spacer layer 230 in the etching process of removing the treated portion 245 can be decreased, thereby maintaining the performance of the semiconductor device, in accordance with some embodiments.

After the inner spacer layers 248 are formed, the processes that were described above and illustrated in FIGS. 2P-1 and 2P-2 may be performed to obtain the semiconductor device 100.

As described above, the inner spacer layer 148 (or 248), formed between the source/drain feature 134 and the gate stack 150, can reduce the parasitic capacitance between the gate stack and the source/drain feature. In addition, the formation of the inner spacer layer 148 (or 248) includes forming a dielectric material 142 (or 242) surrounding second semiconductor layers 108, and locally treating the dielectric material 142 (or 242) in the channel region 116. Because an etching selectivity exists between the treated portion 145 (or 245) and the untreated portion 145U (or 245U) of the dielectric material 142 (or 242), the etching process can be well controlled to entirely remove the treated portion 145 (or 245), thereby leaving the untreated portion 145U (or 245U) as the inner spacer layer 148 (or 248). As a result, the process window of formation of the inner spacer layer 148 (or 248) can be enhanced.

Embodiments of a method for forming a semiconductor device structure are provided. The method for forming the semiconductor device structure may include forming a dielectric material surrounding second semiconductor layers, and locally treating the dielectric material. After the dielectric material is treated, the treated portion of the dielectric material may be etched and the remaining portion of the dielectric material may form an inner spacer layer. Because the etching process is well controlled by locally treating the dielectric material, the process window of the formation of the inner spacer layer may be enhanced.

In some embodiments, a semiconductor device structure is provided. The semiconductor device structure includes a first nanowire structure over a second nanowire structure, a gate stack wrapping around the first nanowire structure and the second nanowire structure, a source/drain feature adjoining the first nanowire structure and the second nanowire structure, a gate spacer layer over the first nanowire structure and between the gate stack and the source/drain feature, and an inner spacer layer between the first nanowire structure and the second nanowire structure and between the gate stack and the source/drain feature. The gate spacer layer has a first carbon concentration, the inner spacer has a second carbon concentration, and the second carbon concentration is lower than the first carbon concentration.

In some embodiments, a semiconductor device structure is provided. The semiconductor device structure includes a first nanowire structure over a second nanowire structure, a high-k dielectric layer including a first portion and a second portion wrapping around a center portion of the first nanowire structure and a center portion of the second nanowire structure, respectively, a first oxide layer and a second oxide layer wrapping around an end portion of the first nanowire structure and an end portion of the second nanowire structure, respectively, a source/drain feature adjoining the end portion of the first nanowire structure and the end portion of the second nanowire structure, and an inner spacer layer between the first oxide layer and the second oxide.

In some embodiments, a semiconductor device structure is provided. The semiconductor device structure includes nanowire structures separated from one another and vertically stacked over a fin structure, a gate stack wrapping around the nanowire structures, a source/drain feature adjacent to the gate stack and the nanowire structures, inner spacer layers interposing between the nanowire structures and separating the gate stack from the source/drain feature, and a gate spacer layer above an uppermost one of the nanowire structures and separating the gate stack from the source/drain feature The gate spacer layer has a first nitrogen concentration, the inner spacer layers have a second nitrogen concentration, and the second nitrogen concentration is greater than the first nitrogen concentration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a first nanowire structure over a second nanowire structure;
    a gate stack wrapping around the first nanowire structure and the second nanowire structure;
    a source/drain feature adjoining the first nanowire structure and the second nanowire structure;
    a gate spacer layer over the first nanowire structure and between the gate stack and the source/drain feature; and
    an inner spacer layer between the first nanowire structure and the second nanowire structure and between the gate stack and the source/drain feature, wherein the gate spacer layer has a first carbon concentration, the inner spacer has a second carbon concentration, and the second carbon concentration is lower than the first carbon concentration.

2. The semiconductor device structure as claimed in claim 1, wherein the gate stack comprises:
    a gate dielectric layer surrounding the first nanowire structure and the second nanowire structure; and
    a gate electrode layer over the gate dielectric layer, wherein the gate dielectric layer includes a first portion between the gate electrode layer and the gate spacer layer and a second portion between the gate electrode layer and the inner spacer layer.

3. The semiconductor device structure as claimed in claim 1, wherein the gate spacer layer has a first sidewall facing the gate stack, the inner spacer layer has a first sidewall facing the gate stack, and the first sidewall of the inner spacer layer is indented from the first sidewall of the gate spacer layer by a distance.

4. The semiconductor device structure as claimed in claim 3, wherein the gate spacer layer has a second sidewall facing the source/drain feature, the inner spacer layer has a second sidewall facing the source/drain feature, and the second sidewall of the inner spacer layer is substantially coplanar with the second sidewall of the gate spacer layer.

5. The semiconductor device structure as claimed in claim 1, wherein the first carbon concentration of the gate spacer layer is in a range from about 11.6 atomic % to about 21.6 atomic %, and an oxygen concentration of the gate spacer layer is in a range from about 43.4 atomic % to about 53.4 atomic %.

6. The semiconductor device structure as claimed in claim 1, wherein the second carbon concentration of the inner spacer layer is in a range from about 5.1 atomic % to about 15.1 atomic %, and an oxygen concentration of the inner spacer layer is in a range from about 55.2 atomic % to about 65.2 atomic %.

7. The semiconductor device structure as claimed in claim 1, further comprising:
    a fin structure below the second nanowire structure, wherein a bottom surface of the source/drain feature is lower than an upper surface of the fin structure.

8. The semiconductor device structure as claimed in claim 1, further comprising:
    a first oxide layer sandwiched between the first nanowire structure and the inner spacer layer; and
    a second oxide layer sandwiched between the second nanowire structure and the inner spacer layer.

9. A semiconductor device structure, comprising:
    a first nanowire structure over a second nanowire structure;
    a high-k dielectric layer including a first portion and a second portion wrapping around a center portion of the first nanowire structure and a center portion of the second nanowire structure, respectively;
    a first oxide layer and a second oxide layer wrapping around an end portion of the first nanowire structure and an end portion of the second nanowire structure, respectively;
    a source/drain feature adjoining the end portion of the first nanowire structure and the end portion of the second nanowire structure; and
    an inner spacer layer between the first oxide layer and the second oxide.

10. The semiconductor device structure as claimed in claim 9, wherein both the first oxide layer and the second oxide layer are in contact with the source/drain feature.

11. The semiconductor device structure as claimed in claim 9, further comprising:
    an interfacial layer including a first portion and a second portion wrapping around the center portion of the first nanowire structure and the center portion of the second nanowire structure, respectively, wherein the high-k dielectric layer wraps around the interfacial layer.

12. The semiconductor device structure as claimed in claim 11, wherein the first oxide layer is in contact with the first portion of the interfacial layer.

13. The semiconductor device structure as claimed in claim 11, wherein the second oxide layer is in contact with the second portion of the interfacial layer.

14. The semiconductor device structure as claimed in claim 9, further comprising:
    a gate electrode layer surrounding the first portion and the second portion of the high-k dielectric layer.

15. The semiconductor device structure as claimed in claim 9, further comprising:
    a gate spacer layer above the first nanowire structure, wherein the high-k dielectric layer includes a third portion along a sidewall of the gate spacer layer, and the gate spacer layer has a first width in a first direction, the inner spacer layer has a second width in the first direction, and the first width is greater than the second width.

16. The semiconductor device structure as claimed in claim 15, wherein the gate spacer layer is made of a first silicon oxide carbonitride with a first carbon concentration, the inner spacer layer is made of a second silicon oxide carbonitride with a second carbon concentration, and the second carbon concentration is lower than the first carbon concentration by at least about 2%.

17. A semiconductor device structure, comprising:
- nanowire structures separated from one another and vertically stacked over a fin structure;
- a gate stack wrapping around the nanowire structures;
- a source/drain feature adjacent to the gate stack and the nanowire structures;
- inner spacer layers interposing between the nanowire structures and separating the gate stack from the source/drain feature; and
- a gate spacer layer above an uppermost one of the nanowire structures and separating the gate stack from the source/drain feature, wherein the gate spacer layer has a first nitrogen concentration, the inner spacer layers have a second nitrogen concentration, and the second nitrogen concentration is greater than the first nitrogen concentration.

18. The semiconductor device structure as claimed in claim 17, wherein the first nitrogen concentration of the gate spacer layer is in a range from about 39.0 atomic % to about 49.0 atomic %, and the second nitrogen concentration of the inner spacer layers is in a range from about 45.5 atomic % to about 55.5 atomic %.

19. The semiconductor device structure as claimed in claim 17, wherein the gate stack comprises:
- an interfacial layer wrapping around the nanowire structures, wherein one of the inner spacer layers is in contact with the interfacial layer and the source/drain feature;
- a gate dielectric layer over the interfacial layer; and
- a gate electrode layer over the gate dielectric layer.

20. The semiconductor device structure as claimed in claim 17, further comprises:
- oxide layers surrounding end portions of the nanowire structures, wherein the inner spacer layers are separated from the nanowire structures by the oxide layers.

* * * * *